(12) United States Patent
Yoshino et al.

(10) Patent No.: US 9,312,045 B2
(45) Date of Patent: Apr. 12, 2016

(54) CONDUCTIVE PASTE COMPOSITION FOR SOLAR CELLS AND SOLAR CELL

(75) Inventors: Yasushi Yoshino, Nagoya (JP); Yusuke Kawamoto, Nagoya (JP); Kosuke Tsunoda, Nagoya (JP)

(73) Assignee: NORITAKE CO., LIMITED, Nagoya-shi (JP)

(*) Notice: Subject to any disclaimer, the term of this patent is extended or adjusted under 35 U.S.C. 154(b) by 167 days.

(21) Appl. No.: 14/235,684

(22) PCT Filed: Jun. 22, 2012

(86) PCT No.: PCT/JP2012/066058
§ 371 (c)(1),
(2), (4) Date: Jan. 28, 2014

(87) PCT Pub. No.: WO2013/018462
PCT Pub. Date: Feb. 7, 2013

(65) Prior Publication Data
US 2014/0225045 A1 Aug. 14, 2014

(30) Foreign Application Priority Data

Jul. 29, 2011 (JP) .................................. 2011-167798
May 2, 2012 (WO) .................. PCT/JP2012/061619

(51) Int. Cl.
*H01L 31/0224* (2006.01)
*H01B 1/16* (2006.01)
*H01B 1/22* (2006.01)
*C03C 3/072* (2006.01)
*C03C 8/10* (2006.01)
*C03C 8/18* (2006.01)

(52) U.S. Cl.
CPC .... *H01B 1/16* (2013.01); *C03C 3/072* (2013.01); *C03C 8/10* (2013.01); *C03C 8/18* (2013.01); *H01B 1/22* (2013.01); *H01L 31/022425* (2013.01); *Y02E 10/50* (2013.01)

(58) Field of Classification Search
None
See application file for complete search history.

(56) References Cited

U.S. PATENT DOCUMENTS

| | | | |
|---|---|---|---|
| 4,256,513 A | 3/1981 | Yoshida et al. | |
| 4,737,197 A | 4/1988 | Nagahara et al. | |
| 5,064,784 A * | 11/1991 | Saito ..................... | C03C 8/02 501/33 |
| 5,661,041 A | 8/1997 | Kano | |
| 2006/0102228 A1 | 5/2006 | Sridharan et al. | |
| 2007/0042891 A1 | 2/2007 | Ritter et al. | |
| 2008/0090034 A1* | 4/2008 | Harrison ................ | B41M 5/385 428/32.71 |
| 2008/0206488 A1* | 8/2008 | Chung .................... | C09D 5/24 427/596 |

(Continued)

FOREIGN PATENT DOCUMENTS

JP   A-55-103775   8/1980
JP   A-62-49676    3/1987

(Continued)

OTHER PUBLICATIONS

International Search Report issued in International Application No. PCT/JP2012/066058 mailed Nov. 5, 2013.

(Continued)

*Primary Examiner* — Mark Kopec
*Assistant Examiner* — Katie L Hammer
(74) *Attorney, Agent, or Firm* — Oliff PLC

(57) ABSTRACT

A conductive paste composition for a solar cell contains a conductive powder, a glass frit, and a vehicle. The glass fit includes glass containing $SO_2$ within a range of 0.05 to 5.0 (mol %) in terms of oxide.

12 Claims, 1 Drawing Sheet

(56) References Cited

U.S. PATENT DOCUMENTS

| | | | |
|---|---|---|---|
| 2009/0013801 A1* | 1/2009 | Yamashita | G01L 1/2287 73/862.045 |
| 2010/0096598 A1 | 4/2010 | Sridharan et al. | |
| 2010/0230667 A1* | 9/2010 | Nakamura | H01L 51/5268 257/40 |
| 2011/0073178 A1* | 3/2011 | Tan | C09D 5/24 136/256 |
| 2011/0309312 A1 | 12/2011 | Sugiyama et al. | |
| 2012/0168691 A1 | 7/2012 | Yoshino et al. | |
| 2013/0099181 A1* | 4/2013 | Yoshino | C03C 8/10 252/519.52 |

FOREIGN PATENT DOCUMENTS

| | | |
|---|---|---|
| JP | A-8-148446 | 6/1996 |
| JP | A-11-213754 | 8/1999 |
| JP | A-2003-338218 | 11/2003 |
| JP | A-2005-8981 | 1/2005 |
| JP | A-2007-51060 | 3/2007 |
| JP | A-2008-520094 | 6/2008 |
| JP | A-2010-199334 | 9/2010 |
| JP | A-2011-66354 | 3/2011 |
| WO | WO 2010/098167 A1 | 9/2010 |
| WO | WO 2011/033945 A1 | 3/2011 |

OTHER PUBLICATIONS

International Preliminary Report on Patentability issued in International Application No. PCT/JP2012/066058 mailed Aug. 21, 2012 (with translation).

* cited by examiner

CONDUCTIVE PASTE COMPOSITION FOR SOLAR CELLS AND SOLAR CELL

TECHNICAL FIELD

The present invention relates to a conductive paste composition preferred for a solar cell electrode formed with a fire-through method.

BACKGROUND ART

For example, a typical silicon-based solar cell has a structure including an antireflection film and a light-receiving surface electrode via an $n^+$ layer on an upper surface of a silicon substrate that is a p-type polycrystalline semiconductor and including a back surface electrode (hereinafter simply referred to as an "electrode" when no distinction is made between these electrodes) via a $p^+$ layer on a lower surface, and electric power generated by receiving light in p-n junction of the semiconductor is extracted through the electrodes. The antireflection film is for the purpose of reducing a surface reflectance while maintaining a sufficient visible light transmittance to increase light reception efficiency and is made up of a thin film of silicon nitride, titanium dioxide, silicon dioxide, etc.

The antireflection film has a high electric resistance value and therefore prevents efficient extraction of electric power generated in the p-n junction of the semiconductor. Therefore, the light-receiving surface electrode of the solar cell is formed with a method called fire-through, for example. In this electrode forming method, for example, after the antireflection film is disposed on the entire surface of the $n^+$ layer, a conductive paste, i.e., a paste-like electrode material, is applied in an appropriate shape onto the antireflection film by using a screen printing method, for example, and is subjected to firing treatment. As a result, the electrode material is heated and melted while the antireflection film in contact therewith is melted at the same time, bringing the light-receiving surface electrode and the semiconductor into contact. The conductive paste consists mainly of, for example, silver powder, glass frit (flaky or powdery fragments of glass formed by melting, quenching, and, if needed, crushing glass raw material), an organic vehicle, and an organic solvent and, since a glass component in the conductive paste breaks the antireflection film in the course of the firing, an ohmic contact is formed by a conductive component in the conductive paste and the layer (see, e.g., Patent Document 1). The conductive paste has been formulated with various trace components consisting of metal such as phosphorus, vanadium, bismuth, and tungsten or a compound etc., so as to acquire conductivity. This electrode forming method simplifies the process as compared to the case of partially removing the antireflection film to form an electrode in the removed portion and has an advantage of causing no problem of displacement between the removed portion and the electrode forming position.

Various proposals have hitherto been made in such a solar cell light-receiving surface electrode formation for a purpose such as enhancing the fire-through property to improve the ohmic contact and consequently increasing a fill factor (FF value), energy conversion efficiency, etc. For example, the group five elements such as phosphorus, vanadium, and bismuth are added to the conductive paste to promote the oxidation-reduction effect of glass and silver on the antireflection film, improving the fire-through property (see, e.g., Patent Document 1). Chloride, bromide, or fluoride is added to the conductive paste to assist the effect of glass and silver breaking the antireflection film with these additives, improving the ohmic contact (see, e.g., Patent Document 2). The fluoride is described as lithium fluoride, nickel fluoride, and aluminum fluoride. Adding the group five elements along with the additives is also described. The glass is borosilicate glass, for example.

It is proposed to include 0.5 to 5 parts by weight of silver phosphate per 100 parts by weight of silver powder into the conductive paste so as to assist the effect of breaking the antireflection film and ensure the ohmic contact (see, e.g., Patent Document 3). It is described that when glass containing zinc oxide as a major component without containing lead is used for forming a paste containing silver, gold, and antimony, the breakage of conjunction does not occur because of absence of penetration of an electrode, thereby ensuring a low contact resistance (see, e.g., Patent Document 4).

It is also proposed for a silver-containing paste containing 85 to 99 (wt %) silver and 1 to 15 (wt %) glass that the glass has a composition containing 15 to 75 (mol %) PbO and 5 to 50 (mol %) $SiO_2$ and not containing $B_2O_3$ (see, e.g., Patent Document 5). This silver-containing paste is used for the solar cell electrode formation and the ohmic contact is considered to be improved by using the glass having the composition described above. The glass can contain 0.1 to 8.0 (mol %) $P_2O_5$ or 0.1 to 10.0 (mol %) $Sb_2O_5$ and can further contain 0.1 to 15.0 (mol %) alkali metal oxide ($Na_2O$, $K_2O$, $Li_2O$).

The applicant of the present application previously proposed a paste composition for a solar cell electrode having a glass fit consisting of glass containing PbO, $B_2O_3$, and $SiO_2$ within ranges of 46 to 57 (mol %), 1 to 7 (mol %), and 38 to 53 (mol %), respectively (see Patent Document 6). The paste composition has an optimum firing temperature range made wider at the time of solar cell electrode formation by selecting the composition ranges of the PbO, $B_2O_3$, and $SiO_2$ as described above. Although an optimum firing temperature range of each substrate may differ due to variation in a manufacturing operation, if the optimum firing temperature range is made wider, a firing temperature is more likely to fall within the range, which improves average output per production lot.

The applicant of the present application previously proposed a paste composition for a solar cell electrode having a glass frit consisting of glass containing 0.6 to 18 (mol %) $LiO_2$, 20 to 65 (mol %) PbO, 1 to 18 (mol %) $B_2O_3$, and 20 to 65 (mol %) $SiO_2$ (see Patent Document 7). The paste composition enables thinning of the light-receiving surface electrode without deteriorating the ohmic contact and line resistance and it is described that containing 0.6 to 18 (mol %) $LiO_2$ sufficiently lowers a softening point to achieve appropriate erodibility. Although Li is generally desirably avoided in semiconductor application and tends to give excessive erodibility particularly to glass with a high amount of Pb, it is found that fire-through property is improved in solar-cell application when an appropriate amount is contained. Li is a donor element and therefore has an effect of reducing contact resistance.

PRIOR ART DOCUMENTS

Patent Documents

Patent Document 1: Japanese Laid-Open Patent Publication No. 62-049676
Patent Document 2: Japanese Laid-Open Patent Publication No. 11-213754
Patent Document 3: Japanese Laid-Open Patent Publication No. 08-148446
Patent Document 4: Japanese Laid-Open Patent Publication No. 55-103775

Patent Document 5: Japanese Unexamined Patent Application Publication (Translation of PCT Application) No. 2008-520094

Patent Document 6: Japanese Laid-Open Patent Publication No. 2010-199334

Patent Document 7: Japanese Laid-Open Patent Publication No. 2011-066354

SUMMARY OF THE INVENTION

Problem to be Solved by the Invention

It is attempted in the solar cell to reduce a thickness of an n layer located on the light-receiving surface side to lower a surface recombination rate such that more electric current is extracted, i.e., to form a shallow emitter. The formation of the shallow emitter causes the short wavelength side, particularly, near 400 (nm), to contribute to electric generation and, therefore, this is considered as an ideal solution in terms of improvement in efficiency of a solar cell. Since the shallow emitter has a thinner n-layer thickness of 70 to 100 (nm) on the light-receiving surface side as compared to 100 to 200 (nm) of a conventional silicon solar cell and reduces a portion of electricity generated by receiving light and unable to be effectively utilized because of conversion into heat before reaching the p-n junction, a short-circuit current increases and, consequently, the electric generation efficiency is advantageously enhanced.

However, since a cell must have higher sheet resistance, the shallow emitter reduces donor element (e.g., phosphorus) concentration in the vicinity of a surface or makes the p-n junction shallow. The reduction in the donor element concentration in the vicinity of the surface increases a barrier between Ag and Si and makes it difficult to ensure an ohmic contact of a light-receiving surface electrode. The shallow p-n junction makes it very difficult to provide penetration depth control such that an antireflection film is sufficiently broken by fire-through while an electrode is prevented from penetrating into the p-n junction.

To certainly achieve the ohmic contact by the fire-through, viscosity of glass must be reduced at firing temperature such that the glass is promptly and uniformly supplied to electrode-silicon interface. It is contemplated that a method of reducing the viscosity is to adjust an amount of alkali etc., to reduce the softening point or to change composition, i.e., a constituent ratio of Pb, Si, B, and Zn, which are components making a framework of glass (hereinafter referred to as "composition change"). Since the composition change has a significant effect on erosion amount control, an alkali amount is typically increased; however, this makes an erosion rate higher during fire-through and, therefore, control of firing conditions such as temperature becomes more difficult. In either case, it is difficult to satisfy both the ohmic contact and the erosion amount control.

The present invention was conceived in view of the situations and it is therefore an object of the present invention to provide a conductive paste composition for a solar cell facilitating control of a penetration amount of an electrode material while facilitating acquisition of an ohmic contact during fire-through.

Means for Solving the Problem

To achieve the object, the present invention provides a conductive paste composition for a solar cell containing a conductive powder, a glass frit, and a vehicle, the glass frit comprising glass containing $SO_2$ within a range of 0.05 to 5.0 (mol %) in terms of oxide.

Effects of the Invention

Since this leads to 0.05 to 5.0 (mol %) $SO_2$ contained in the glass frit in the conductive paste composition for a solar cell, viscosity can be reduced when glass is softened while erodibility is kept at the same level as compare to when $SO_2$ is not contained, without increasing an alkali amount or changing a composition. Therefore, since surface tension is reduced at the time of the softening, a glass component is promptly supplied to an electrode-substrate interface and, thus, a uniform thin glass layer is formed in the interface, providing favorable electric characteristics. Therefore, the conductive paste composition for a solar cell is acquired that facilitates the control of a penetration amount of an electrode material while facilitating the acquisition of an ohmic contact during fire-through. In particular, the conductive paste composition is acquired that is preferably usable even when an electrode is formed by the fire-through method on a solar cell with a shallow emitter structure having a thin n layer using a substrate with a high sheet resistance of about 80 to 120 (Ω/square), for example.

Although well-known as a component reducing the viscosity of glass, $SO_2$ is not considered for a conductive paste containing Ag because of concerns about a reaction between Ag and S. When considering a composition containing $SO_2$ as an additional evaluation object in the course of studying various compositions, the present inventors found out that if a trace amount up to at least about 5 (mol %) is contained in glass, a reaction with Ag is not recognized and that the effect of reducing viscosity can be enjoyed. The present invention was conceived based on such knowledge.

If the glass is promptly supplied to the electrode-substrate interface as described above, glass hardly remains in the electrode and, therefore, solder erosion easily occurs during soldering, causing a problem of inability to acquire sufficient adhesion strength. However, the conductive paste composition of the present invention contains $SO_2$ in glass and therefore hardly causes the solder erosion even if a smaller amount of glass remains in the electrode. Thus, both the output characteristics and the soldering characteristics may advantageously be satisfied.

By providing control such that electrode material does not penetrate into the p-n junction as described above, a solar battery cell can be manufactured that has low leak current (i.e., high Rsh), a high FF value, a high current value, and high photoelectric conversion efficiency.

Preferably, the glass has Pb/Si (mol ratio) within a range of 0.8 to 2.3 and contains 0.6 to 18 (mol %) of $Li_2O$, 18 to 64 (mol %) of PbO, 1 to 18 (mol %) of $B_2O_3$, and 15 to 47 (mol %) of $SiO_2$ in terms of oxide. The glass composition of the glass fit contained in the conductive paste of the present invention is not particularly limited and various types of glass may be used as long as the glass may be used for forming a surface electrode with the fire-through method in the manufacturing process of the solar cell. For example, lead-based glass containing Li preferably has the composition described above. The glass more preferably has a composition containing 0.1 to 5.0 (mol %) of $SO_2$, 1 to 15 (mol %) of $Li_2O$, 22 to 62 (mol %) of PbO, 1 to 15 (mol %) of $B_2O_3$, and 20 to 41 (mol %) of $SiO_2$ in terms of oxide.

Preferably, the glass has Pb/Si (mol ratio) within a range of 1.4 to 2.5 and contains 50 to 70 (mol %) of PbO, 1 to 8 (mol %) of $B_2O_3$, and 20 to 40 (mol %) of $SiO_2$ in terms of oxide without $Li_2O$. The present invention is preferably applied to conductive paste compositions containing glass frit consisting not only of the lead-based glass containing Li but also of lead-based glass without Li. The lead-based glass without Li preferably has a composition as described above, for example. The glass more preferably has a composition containing Pb/Si (mol ratio) within a range of 1.7 to 2.3 and 0.1 to 3.0 (mol %) of $SO_2$, 55 to 62 (mol %) of PbO, 3 to 6 (mol %) of $B_2O_3$, and 28 to 34 (mol %) of $SiO_2$ in terms of oxide.

In the glass fit composition, PbO is a component for lowering the softening point of glass to enable low-temperature firing. To acquire preferable fire-through property, a Li-containing system must contain 18 to 64 (mol %) PbO and a Li-free system must contain 50 to 70 (mol %) PbO. In either system, if the amount of PbO is less than the lower limit value, since the softening point becomes too high, the vitrification becomes difficult and the antireflection film is hardly eroded, consequently making it difficult to acquire a favorable ohmic contact. On the other hand, if the amount of PbO exceeds the upper limit value, since the softening point becomes too low, the erodibility becomes too strong and the p-n junction is easily broken, consequently causing a problem of a smaller FF value etc. In the Li-containing system, the amount of PbO is more preferably equal to or greater than 22 (mol %) and more preferably equal to or less than 62 (mol %). In other words, the range of 22 to 62 (mol %) is more preferable. The amount of PbO is further preferably equal to or greater than 32 (mol %) and the range of 32 to 62 (mol %) is particularly preferable. In the Li-free system, the amount of PbO is more preferably equal to or greater than 55 (mol %) and more preferably equal to or less than 62 (mol %). In other words, the range of 55 to 62 (mol %) is particularly preferable.

$B_2O_3$ is a glass forming oxide (i.e., a component that makes a framework of glass) and is a component for lowering the softening point of glass, and the Li-containing system must contain 1 to 18 (mol %) $B_2O_3$ and the Li-free system must contain 1 to 8 (mol %) $B_2O_3$ to acquire favorable fire-through property. In either system, if the amount of $B_2O_3$ is less than the lower limit value, since the softening point becomes too high, the antireflection film is hardly eroded, consequently making it difficult to acquire a favorable ohmic contact and lowering humidity resistance. A reduced amount of $B_2O_3$ also causes a problem that leak current tends to increase in addition that Voc tends to decrease. On the other hand, if the amount of $B_2O_3$ exceeds the upper limit, Voc decreases while the leak current increases and, since the softening point becomes too low, the erodibility becomes too strong, causing a problem of an easily breakable p-n junction etc. In the Li-containing system, the amount of $B_2O_3$ is more preferably equal to or less than 15 (mol %). The amount of $B_2O_3$ is more preferably equal to or greater than 3 (mol %) and more preferably equal to or less than 12 (mol %). In other words, the range of 3 to 12 (mol %) is particularly preferable. In the Li-free system, the amount of $B_2O_3$ is more preferably equal to or greater than 3 (mol %) and more preferably equal to or less than 6 (mol %). In other words, the range of 3 to 6 (mol %) is particularly preferable.

$SiO_2$ is a glass forming oxide and is a component for increasing chemical resistance of glass, and the Li-containing system must contain 15 to 47 (mol %) $SiO_2$ and the Li-free system must contain 20 to 40 (mol %) $SiO_2$ to acquire favorable fire-through property. In either system, an amount of $SiO_2$ less than the lower limit value makes the chemical resistance insufficient and the glass formation difficult and, on the other hand, if the amount of $SiO_2$ exceeds the upper limit value, since the softening point becomes too high, the vitrification becomes difficult and the antireflection film is hardly eroded, consequently making it difficult to acquire a favorable ohmic contact. In the Li-containing system, the amount of $SiO_2$ is more preferably equal to or greater than 20 (mol %) and more preferably equal to or less than 41 (mol %). In other words, the range of 20 to 41 (mol %) is more preferable. The amount of $SiO_2$ is further preferably equal to or less than 35 (mol %) and the range of 20 to 35 (mol %) is particularly preferable. In the Li-free system, the amount of $SiO_2$ is more preferably equal to or greater than 28 (mol %) and more preferably equal to or less than 34 (mol %). In other words, the range of 28 to 34 (mol %) is particularly preferable.

Not only are PbO and $SiO_2$ within the respective ranges, Pb/Si (mol ratio) must be in the range of 0.8 to 2.3 in the case of the Li-containing system or 1.4 to 2.5 in the case of the Li-free system. In either system, if the Pb/Si mol ratio is less than the lower limit value, the fire-through property deteriorates and contact resistance between the light-receiving surface electrode and the n layer increases. On the other hand, if the Pb/Si mol ratio exceeds the upper limit value, since a leak current (diode current) Id significantly increases, a FF value decreases at any rate and sufficient output characteristics cannot be acquired. The Pb/Si (mol ratio) is more preferably within the range of 1.7 to 2.3 in the case of the Li-free system.

$Li_2O$ is a component lowering the softening point of glass, and is contained in the range equal to or greater than 0.6 (mol %) and equal to or less than 18 (mol %) to acquire favorable fire-through property. If $Li_2O$ is less than 0.6 (mol %), the softening point becomes too high and, consequently, the erodibility to the antireflection film is insufficient. On the other hand, if $Li_2O$ exceeds 18 (mol %), since the erodibility becomes too high, the electric characteristics deteriorate. Since diffusion is promoted, Li is generally considered as impurity for semiconductors and is desirably avoided in the semiconductor application because of the tendency to deteriorate the characteristics. Particularly, if the amount of Pb is large, the inclusion of Li normally makes the erodibility too strong and tends to make control difficult. However, in the solar cell application as described above, characteristic deterioration due to the usage of glass containing Li is not recognized and, conversely, it is recognized that the inclusion of an appropriate amount of Li improves the fire-through property and enhances the characteristics. Li is a donor element and can reduce the contact resistance. Moreover, it is recognized that a composition including Li broadens a glass composition range enabling the acquisition of favorable fire-through property. However, even in the solar cell application, if Li is excessively contained, the erodibility becomes too strong and the electric characteristics tend to deteriorate. The amount of $Li_2O$ is more preferably equal to or greater than 1 (mol %) and more preferably equal to or less than 15 (mol %). In other words, the range of 1 to 15 (mol %) is further preferable.

However, in the present invention, $Li_2O$ may not be contained as described above. If Li diffuses in Si, the leak current increases and, therefore, it is desirable not to contain $Li_2O$ from this standpoint. Li is a donor element and has effects of facilitating the acquisition of the ohmic contact and broadening the glass composition range; however, these effects are sufficiently improved by adjusting a composition as needed.

Although it is not necessarily easy to identify what form the components described above and later are contained in glass, all the proportions of these components are defined as oxide-converted values.

Preferably, the glass includes at least one of $Al_2O_3$, $TiO_2$, and ZnO. A composition containing an appropriate amount of Al, Ti, and Zn improves a parallel resistance Rsh and thus improves the open-circuit voltage Voc and short-circuit current Isc and, therefore, higher electric characteristics can be acquired. In other words, the FF value becomes higher and the leak current is further reduced. The amount of PbO can advantageously be reduced. With regard to contents of these components in the Li-containing system, the glass contains 18 (mol %) or less of $Al_2O_3$, 18 (mol %) or less of $TiO_2$, and 30 (mol %) or less of ZnO in terms of oxide. In the Li-free system, the glass contains 5 (mol %) or less of $Al_2O_3$, 10 (mol %) or less of $TiO_2$, and 10 (mol %) or less of ZnO in terms of oxide. If $Al_2O_3$, $TiO_2$, or ZnO becomes excessive, the leak current tends to increase and, therefore, the amounts are preferably set as respective upper limits.

$Al_2O_3$ is an effective component for acquiring stability of glass and the inclusion of $Al_2O_3$ lowers the viscosity of glass and tends to reduce a serial resistance Rs, to increase the FF value, and to broaden a firing temperature range; however, since excessive $Al_2O_3$ increases the leak current and reduces Voc as described above, $Al_2O_3$ is preferably limited to 18 (mol %) or less in the Li-containing system and to 5 (mol %) or less in the Li-free system.

Although $TiO_2$ tends to increase the FF value, since the excessive addition tends to raise the softening point and thus increase the contact resistance and also has the effect of increasing the leak current as described above, $TiO_2$ is preferably limited to 18 (mol %) or less in the Li-containing system and to 10 (mol %) or less in the Li-free system.

Since an excessive contained amount of ZnO reduces the open-circuit voltage Voc, ZnO is preferably limited to 30 (mol %) or less in the Li-containing system and to 10 (mol %) or less in the Li-free system.

The glass can contain 0.1 to 15 (mol %) of $Bi_2O_3$ in terms of oxide. In particular, although a solid solution amount of Ag in the glass layer of the electrode-silicon interface must be increased to acquire an ohmic contact, since the increase is limited when Pb is solely used, the solid solution amount of Ag is increased by allowing Pb and Bi to coexist. Although a solid solution of Ag in glass is precipitated as fine particles of Ag during temperature decrease at the time of firing, the presence of Bi moderates the precipitation of Ag relative to a change in the firing temperature, broadening a firing margin. Due to the above effects, electric characteristics are improved. However, as is the case with Pb, because of a strong effect of eroding Si, an excessive addition amount of Bi makes erosion too strong and has adverse effects such as deterioration in electric characteristics and reduction in the firing margin and, therefore, the appropriate amount of $Bi_2O_3$ is 15 (mol %) or less and more preferably 12 (mol %) or less.

$Bi_2O_3$ can be added regardless of whether the Li-containing system or the Li-free system. Specifically, the glass has Pb/Si (mol ratio) within the range of 0.8 to 2.3 and is configured to contain 0.05 to 5.0 (mol %) $SO_2$, 0.6 to 18 (mol %) $Li_2O$, 18 to 64 (mol %) PbO, 1 to 18 (mol %) $B_2O_3$, 15 to 47 (mol %) $SiO_2$, and 0.1 to 15 (mol %) $Bi_2O_3$ in terms of oxide and is more preferably configured to contain 0.1 to 5.0 (mol %) $SO_2$, 1 to 15 (mol %) $Li_2O$, 22 to 62 (mol %) PbO, 1 to 15 (mol %) $B_2O_3$, 20 to 41 (mol %) $SiO_2$, and 0.1 to 12 (mol %) $Bi_2O_3$ in terms of oxide. These types of glass can also contain at least one of 18 (mol %) or less $Al_2O_3$, 18 (mol %) or less $TiO_2$, and 30 (mol %) or less ZnO in terms of oxide. The glass has Pb/Si (mol ratio) within the range of 1.4 to 2.5 and is configured to contain 0.05 to 5.0 (mol %) $SO_2$, 50 to 70 (mol %) PbO, 1 to 8 (mol %) $B_2O_3$, 20 to 40 (mol %) $SiO_2$, and 0.1 to 15 (mol %) $Bi_2O_3$ in terms of oxide without containing $Li_2O$, and more preferably has Pb/Si (mol ratio) within the range of 1.7 to 2.3 and is configured to contain 0.1 to 3.0 (mol %) $SO_2$, 55 to 62 (mol %) PbO, 3 to 6 (mol %) $B_2O_3$, 28 to 34 (mol %) $SiO_2$, and 0.1 to 12 (mol %) $Bi_2O_3$ in terms of oxide without containing $Li_2O$. These types of glass can also contain at least one of 5 (mol %) or less $Al_2O_3$, 10 (mol %) or less $TiO_2$, and 10 (mol %) or less ZnO in terms of oxide.

Preferably, the glass contains 6.0 (mol %) or less of $P_2O_5$ in terms of oxide. As a result, since P contained in glass diffuses in the electrode-substrate interface and the donor concentration is increased in the interface, the insufficient donor element concentration in the shallow emitter is compensated and the acquisition of the ohmic contact is advantageously facilitated between the electrode and the substrate.

Even if glass containing Li is used, compensating effect of Li alone is insufficient for the insufficient donor element concentration in the shallow emitter. To acquire a sufficient compensating effect, it is desirable to contain a plurality of types of donor elements having impurity solubility of $1\times 10^{-19}$ (atom/$cm^3$) to Si or larger in the vicinity of the fire-through firing temperature of 760 to 800 (degrees C.). Since the P is a donor element as is the case with Li, for example, a composition containing both Li and P is considered to be preferable. Alternatively, Sb, As, etc., may be used.

In the case of a cell with high sheet resistance making up the shallow emitter, it is desirable to set the thickness dimension of the antireflection film consisting of, for example, $Si_3N_4$, to about 80 (nm) and to control an amount of erosion by an electrode within the range of 80 to 90 (nm), i.e., at the accuracy within 10 (nm). According to the present invention, the glass contains $SO_2$, the erosion amount control is easy and, if the donor element concentration is compensated as described above, even though the erosion becomes slightly excessive for securing conduction, output reduction due to the excessive erosion is suppressed and, therefore, the acquisition of the ohmic contact is facilitated.

The glass frit has an average particle diameter (D50) within the range of 0.3 to 3.0 (μm). If the average particle diameter of the glass fit is too small, glass melts too fast at the time of firing of the electrode and deteriorates the electric characteristics; however, if the average particle diameter is equal to or greater than 0.3 (μm), appropriate meltability can be acquired and the electric characteristics are further enhanced. Since aggregation hardly occurs, more favorable dispersibility can also be acquired when the paste is prepared. If the average particle diameter of the glass frit is significantly larger than the average particle diameter of conductive powder, the overall dispersibility of powder is reduced; however, more favorable dispersibility can be acquired if the average particle diameter is equal to or less than 3.0 (μm). Higher fusibility of glass can also be acquired. Therefore, the average particle diameter described above is preferred for acquiring a more favorable ohmic contact.

The average particle diameter of the glass fit is a value from an air permeability method. The air permeability method refers to a method of measuring a specific surface area of powder from permeability of fluid (e.g., air) through a powder layer. This measuring method is on the basis of the Kozeny-Carmann equation indicative of relationship between a wet surface area of all the particles making up the powder layer and a flow rate and a pressure drop of fluid passing through the powder layer and includes obtaining a specific surface area of a sample by measuring a flow rate and a pressure drop for a powder layer filled under the condition determined by an apparatus. This method obtains a wet surface area of particles acting against a flow of air by considering gaps of the filled powder particles as fine pores and normally indicates a value smaller than a specific surface area obtained by a gas absorption method. The average particle diameter on the assumption of powder particles can be calculated from the obtained specific surface area and a particle density.

Preferably, the conductive powder is silver powder having an average particle diameter (D50) within the range of 0.3 to 3.0 (μm). Although copper powder, nickel powder, etc., may be used as the conductive powder, the silver powder is most preferred for acquiring higher electric conductivity. If the average particle diameter of the silver powder is equal to or less than 3.0 (μm), more favorable dispersibility can be acquired and, therefore, higher electric conductivity can be acquired. If the average particle diameter is equal to or greater than 0.3 (μm), the aggregation is suppressed and more favorable dispersibility can be acquired. Since silver powder less than 0.3 (μm) is significantly expensive, the average particle diameter is preferably equal to or greater than 0.3 (μm) in terms of manufacturing cost. If both the conductive powder and the glass frit have the average particle diameters equal to or less than 3.0 (μm), it is advantageous that clogging hardly occurs when an electrode is printed and formed in a narrow line pattern.

The silver powder is not particularly limited and the powder of any shape such as a spherical shape or a scale shape may be used for enjoying the basic effect of the present invention that enables narrower lines while the electric conductivity is maintained. However, for example, if spherical powder is used, since excellent printability is achieved and a filling rate of the silver powder is increased in an applied film, and additionally because highly-conductive silver is used, the electric conductivity of the electrode generated from the applied film is increased as compared to the case of using the silver powder of another shape such as a scale shape. As a result, since a line width can be made narrower while ensuring necessary electric conductivity, this is particularly preferable.

Preferably, the conductive paste composition for a solar cell has viscosity at 25 (degrees C.) and 20 (rpm) within the range of 150 to 250 (Pa·s) and a viscosity ratio (i.e., [viscosity at 10 (rpm)]/[viscosity at 100 (rpm)]) of 3 to 8. When a paste having such viscosity characteristics is used, since the viscosity is preferably lowered at the time of squeezing to allow passage of the paste through a screen mesh and, after passing through, the viscosity returns to the higher level to suppress the broadening of the print width, a narrow line pattern can easily be acquired while maintaining the printability such that the paste easily passes through the screen without causing clogging. The viscosity of the paste composition is more preferably within the range of 200 to 220 (Pa·s) and the viscosity ratio is more preferably within the range of 3.2 to 6.5. If narrower lines are achieved with a design line width equal to or less than 100 (μm), the viscosity ratio is desirably 4 to 6.

Even if a line width is narrowed, the thickening of the film thickness for maintaining a cross-section area can also be achieved by increasing an emulsion thickness of a printing plate, by increasing the tension, and by narrowing a line diameter and widening an opening diameter, for example. However, if an emulsion thickness is increased, since the plate is not smoothly separated, the stability of the print pattern shape cannot be achieved. If the tension is increased or the line diameter is narrowed, since the screen mesh becomes easily stretchable, it is problematic that the dimension/shape accuracy is hardly maintained and that the durability of the printing plate is reduced. Since a bus bar is also thickened although the bus bar is disposed with a wide width and does not require the thickening of the film thickness, wasted material is problematically increased.

Preferably, the conductive paste composition for a solar cell contains the conductive powder and the vehicle at proportions within ranges of 64 to 90 parts by weight and 3 to 20 parts by weight, respectively. This enables the acquisition of the paste composition having favorable printability and facilitating the formation of an electrode with a narrow line width and high electric conductivity.

Preferably, the conductive paste composition contains the glass frit within the range of 1 to 10 parts by weight per 100 parts by weight of the conductive powder. If 1 part by weight or more of the glass frit is contained, sufficient erodibility (fire-through property) can be acquired and, therefore, a more favorable ohmic contact can be acquired. If the glass frit is limited to 10 parts by weight or less, an insulated layer is hardly formed and, therefore, sufficient electric conductivity can be achieved. The amount of glass per 100 parts by weight of the conductive powder is more preferably 1 to 8 parts by weight and is further preferably 1 to 7 parts by weight.

The conductive composition of the present invention may preferably control the diffusion of silver at the time of formation of an electrode with fire-through as described above and thus may preferably be used for the light-receiving surface electrode.

Although the glass frit can be synthesized from various vitrifiable raw materials within the composition ranges and, for example, oxide, carbonate, and nitrate are included, silicon dioxide $SiO_2$, boron oxide $B_2O_3$ or boric acid $H_3BO_3$, minium $Pb_3O_4$, and ammonium sulphate $(NH_4)_2SO_4$ may be used as sources of Si, B, Pb, and S, respectively, for example.

If the composition contains other components such as P, Al, and Zr in addition to the main components Si, B, and Pb, oxide, hydroxide, carbonate, nitrate, etc., thereof may be used, for example. For example, Lithium carbonate $Li_2CO_3$, ammonium dihydrogen phosphate $NH_4H_2PO_4$, bismuth oxide $Bi_2O_3$ may be used as sources of Li, P, and Bi, respectively, The glass making up the conductive paste of the present invention may contain other various glass constituent components and additives within a range not deteriorating the characteristics thereof. For example, Na, Ca, Mg, K, Ba, Sr, etc., may be contained. These components and additives may be contained within the range equal to or less than 30 (mol %) in total, for example.

MODES FOR CARRYING OUT THE INVENTION

An embodiment of the present invention will now be described in detail with reference to the drawings. In the following embodiment, diagrams are simplified or modified as needed and dimensional ratios and shapes of portions are not necessarily exactly depicted.

Figure 1:
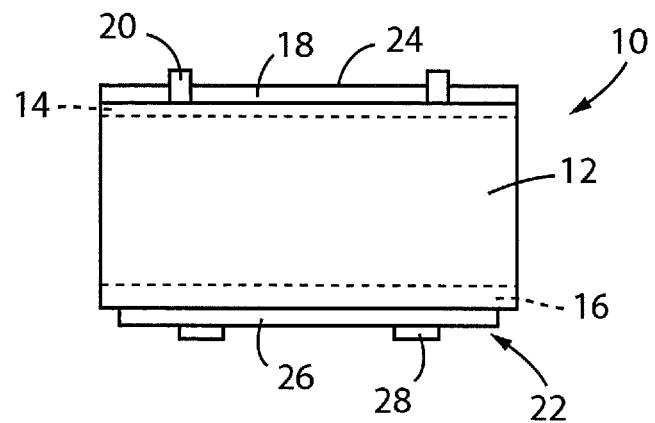
FIG. 1 is a schematic diagram of a cross section structure of a solar cell, which a paste composition for an electrode of an embodiment of the present invention is applied to formation of a light-receiving surface electrode.

FIG. 1 is a schematic of a cross section structure of a silicon solar cell 10 to which a conductive composition of an embodiment of the present invention is applied. In FIG. 1, the solar cell 10 includes, for example, a silicon substrate 12 that is a p-type polycrystalline semiconductor, an n layer 14 and a $p^+$ layer 16 formed respectively on the upper and lower surfaces thereof, an antireflection film 18 and a light-receiving surface electrode 20 formed on the n layer 14, and a rear surface electrode 22 formed on the $p^+$ layer 16. The thickness dimension of the silicon substrate 12 is about 100 to 200 (μm), for example.

The n layer 14 and the p+ layer 16 are disposed by forming layers having high impurity concentrations on the upper and lower surfaces of the silicon substrate 12, and the thickness dimensions of the high concentration layers are about 70 to 100 (nm) for the n layer 14, for example, and about 500 (nm) for the p+ layer 16, for example. Although the n layer 14 is about 100 to 200 (nm) in a typical silicon solar cell, the n layer 14 of this embodiment has a thinner thickness and forms a structure called shallow emitter. The impurity contained in the n layer 14 is an n-type dopant, for example, phosphorus (P), and the impurity contained in the p+ layer 16 is a p-type dopant, for example, aluminum (Al) or boron (B).

The antireflection film 18 is, for example, a thin film made of silicon nitride $Si_3N_4$ etc., and is disposed with, for example, an optical thickness of about ¼ of the visible light wavelength, for example, about 80 (nm), to have an extremely low reflectance equal to 10 (%) or less, for example, about 2 (%).

Figure 2:
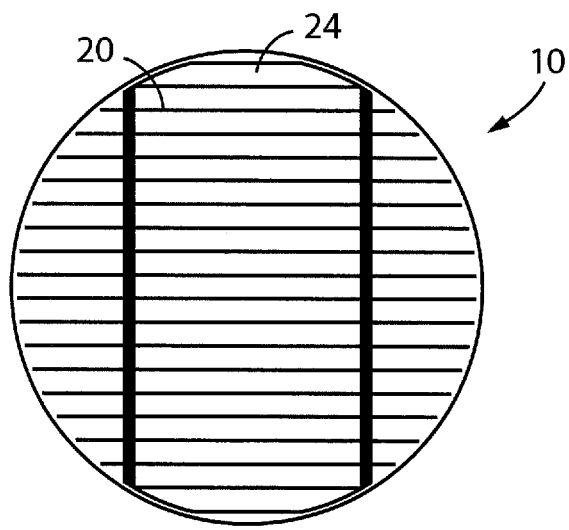
FIG. 2 is a diagram depicting an example of the pattern of a light-receiving surface electrode for a solar cell in FIG. 1.

The light-receiving surface electrode 20 consists of a thick film conductor having a uniform thickness dimension, for example, and is disposed in a comb-like planar shape having a multiplicity of thin line portions on substantially an entire surface of a light-receiving surface 24 as depicted in FIG. 2.

The thick film conductor is made of a thick film silver containing glass within the range of 1 to 10 parts by weight, for example, at 6.0 parts by weight, per 100 parts by weight of Ag and the glass is lead glass containing, in terms of oxide, PbO within the range of 18 to 64 (mol %), for example, at about 45 (mol %), $B_2O_3$ within the range of 1 to 18 (mol %), for example, at about 6.0 (mol %), $SiO_2$ within the range of 15 to 47 (mol %), for example, at about 28.0 (mol %), $Al_2O_3$ within the range of 0 to 18 (mol %), for example, at about 6.0 (mol %), $Li_2O$ within the range of 0.6 to 18 (mol %), for example, at about 6.0 (mol %), $TiO_2$ within the range of 0 to 18 (mol %), for example, at 0 (mol %), ZnO within the range of 0 to 30 (mol %), for example, at 5 (mol %), $ZrO_2$ within the range of 0 to 0.5 (mol %), for example, at 0.5 (mol %), $P_2O_5$ within the range of 0 to 6 (mol %), for example, at about 2.0 (mol %), and $SO_2$ within the range of 0.05 to 5.0 (mol %), for example, at 1.5 (mol %). The lead glass contains PbO and $SiO_2$ such that the Pb/Si mol ratio is within the range of 0.8 to 2.3, for example, at a ratio of about 1.61. The glass can further contain $Bi_2O_3$ within the range of 0.1 to 15 (mol %), preferably, within the range of 0.1 to 12 (mol %) in terms of oxide.

Instead of the glass described above, glass without Li is usable. The glass composition in this case corresponds to lead glass containing, in terms of oxide, PbO within the range of 50 to 70 (mol %), for example, at about 60 (mol %), $B_2O_3$ within the range of 1 to 8 (mol %), for example, at about 6.0 (mol %), $SiO_2$ within the range of 20 to 40 (mol %), for example, at about 28.0 (mol %), $Al_2O_3$ within the range of 0 to 5 (mol %), for example, at about 1.0 (mol %), $TiO_2$ within the range of 0 to 10 (mol %), for example, at about 2.0 (mol %), ZnO within the range of 0 to 10 (mol %), for example, at 0 (mol %), $ZrO_2$ within the range of 0 to 1.0 (mol %), for example, at 0 (mol %), $P_2O_5$ within the range of 0 to 6 (mol %), for example, at about 2.0 (mol %), and $SO_2$ within the range of 0.05 to 5.0 (mol %), for example, at 1.0 (mol %). The lead glass contains PbO and $SiO_2$ such that the Pb/Si mol ratio is within the range of 1.4 to 2.5, for example, at a ratio of about 2.14. The glass can further contain $Bi_2O_3$ within the range of 0.1 to 15 (mol %), preferably, within the range of 0.1 to 12 (mol %) in terms of oxide.

The thickness dimension of the conductive layer is, for example, within the range of 20 to 30 (μm), for example, about 25 (μm), and each of the thin line portions has a width dimension, for example, within the range of 80 to 130 (μm), for example, of about 100 (μm), and has sufficiently high electric conductivity.

The rear surface electrode 22 is made up of an entire surface electrode 26 formed by applying a thick film material having aluminum as a conductive component onto substantially the entire surface of the p+ layer 16 and a belt-like electrode 28 made of a thick film silver applied in a belt shape onto the entire surface electrode 26. The belt-like electrode 28 is disposed for the purpose of enabling soldering of conductive wires etc., to the rear surface electrode 22.

The light-receiving surface electrode 20 as described above is formed by using a paste for an electrode consisting of a conductive powder, a glass frit, a vehicle, and a solvent, for example, with a well-known fire-through method. An example of a manufacturing method of the solar cell 10 including the light-receiving surface electrode formation will hereinafter be described.

First, the glass fit is manufactured. Ammonium sulphate $(NH_4)_2SO_4$, Lithium carbonate $Li_2CO_3$, ammonium dihydrogen phosphate $NH_4H_2PO_4$, silicon dioxide $SiO_2$, boron oxide $B_2O_3$, minium $Pb_3O_4$, aluminum oxide $Al_2O_3$, titanium oxide $TiO_2$, zinc oxide ZnO, and bismuth oxide $Bi_2O_3$ are prepared as sources of S, Li, P, Si, B, Pb, Al, Ti, Zn, and Bi, respectively, and are weighed and blended so as to achieve appropriate composition within the ranges described above. Boric acid $H_3BO_3$ may be used as the source of B instead of boron oxide $B_2O_3$. These are put into a crucible, melted for about 30 minutes to one hour at a temperature within a range of 900 to 1200 (degrees C.) depending on the composition, and quenched for vitrification. The glass is crushed by using a suitable crushing device such as a planetary mill and ball mill. The average particle diameter (D50) after crushing is, for example, within a range of about 0.3 to 3.0 (μm), for example, about 1.5 (μm). The average particle diameter of the glass powder is calculated by using the air permeability method.

On the other hand, the conductive powder is prepared as commercially available spherical silver powder having, for example, an average particle diameter (D50) within the range of 0.3 to 3.0 (μm), for example, an average particle diameter of about 1.6 (μm). By using such silver powder having a sufficiently small average particle diameter, a filling rate of the silver powder is increased in an applied film and the electric conductivity of the conductor can consequently be increased. The vehicle is prepared by dissolving an organic binder in an organic solvent; for example, butyl carbitol acetate is used as the organic solvent; and, for example, ethyl cellulose is used as the organic binder. The proportion of ethyl cellulose in the vehicle is about 15 (wt %), for example. A solvent added separately from the vehicle is butyl carbitol acetate, for example. Although this is not a limitation, the solvent may be the same as that used for the vehicle. This solvent is added for the purpose of adjusting the viscosity of the paste.

After the paste raw materials are prepared and the conductive powder, the glass frit, the vehicle, and the solvent are weighed to be within the ranges of 77 to 90 (wt %), 1 to 8 (wt %), 5 to 14 (wt %), and 3 to 5 (wt %), respectively, for example, and are mixed by using a stirring machine, etc., a dispersion process is executed by a three-roll mill, for example. As a result, the paste for an electrode is acquired.

While the paste for an electrode is prepared as described above, an impurity is dispersed or implanted in an appropriate silicon substrate with, for example, a well-known method such as a thermal diffusion method and ion implantation to form the n layer 14 and the p+ layer 16 to manufacture the silicon substrate 12. A silicon nitride thin film is then formed thereon with a suitable method, for example, PE-CVD (plasma CVD), to dispose the antireflection film 18.

The paste for an electrode is then screen-printed in the pattern depicted in FIG. 2 on the antireflection film 18. The paste is dried at 150 (degrees C.), for example, and is subjected to firing treatment at a temperature within the range of 700 to 900 (degrees C.) in a near-infrared furnace. As a result, since the glass component in the paste for an electrode melts the antireflection film 18 in the course of the firing and the paste for an electrode breaks the antireflection film 18, electric connection is achieved between the conductive component, i.e., silver, in the paste for an electrode and the n layer 14, and the ohmic contact is acquired between the silicon substrate 12 and the light-receiving surface electrode 20 as depicted in FIG. 1. The light-receiving surface electrode 20 is formed as described above.

Although the solar cell 10 of this embodiment is disposed with the light-receiving surface electrode 20 by using the fire-through method as described above, since the light-receiving surface electrode 20 is made of the thick film silver containing glass, which contains 0.05 to 5.0 (mol %) $SO_2$, within the range of 1 to 10 parts by weight per 100 parts by weight of silver as described above, the thick film silver paste has viscosity lowered when the glass is softened while maintaining preferred erodibility without increasing an amount of alkali metal such as Li, Na, and K or changing a composition, as indicated by the composition. Therefore, since a uniform thin glass layer (not depicted) is formed in the interface between the light-receiving surface electrode 20 and the n layer 14, the solar cell 10 with excellent electric characteristics is acquired.

In particular, since glass contains $SO_2$ as described above in the light-receiving surface electrode 20 of this embodiment, when the glass softens during the firing treatment for fire-through, surface tension is lowered and, therefore, the glass component is promptly supplied to the interface between the electrode 20 and the substrate 12. Thus, because the thin glass layer as described above is formed in the interface thereof, a penetrating amount of the thick film silver is easily controlled during fire-through and the ohmic contact is easily acquired.

Additionally, since the light-receiving surface electrode 20 of this embodiment includes a smaller glass amount of about 6.0 parts by weight and thus has high electric conductivity as described above, the line resistance is low even though both the film thickness and the line width are made smaller and, therefore, also because of low contact resistance, the photoelectric conversion efficiency of the solar cell 10 is improved.

The rear surface electrode 22 may be formed after the above operation or may be formed by firing at the same time as the light-receiving surface electrode 20. When the rear surface electrode 22 is formed, for example, an aluminum paste is applied to the entire rear surface of the silicon substrate 12 with a screen printing method etc., and is subjected to the firing treatment to form the entire surface electrode 26 consisting of an aluminum thick film. The paste for an electrode is then applied onto the surface of the entire surface electrode 26 in a belt shape by using the screen printing method etc., and is subjected to the firing treatment to form the belt-like electrode 28. As a result, the rear surface electrode 22 is formed that consists of the entire surface electrode 26 covering the entire rear surface and the belt-like electrode 28 disposed on a portion of the surface thereof in a belt shape, and the solar cell 10 is acquired. In the operation described above, if the concurrent firing is used for the fabrication, the printing process is executed before the firing of the light-receiving surface electrode 20.

Description will be made of results of evaluation of the solar cells 10 manufactured in accordance with the manufacturing process described above with variously changed glass compositions. With regard to the solar cell characteristics, the fill factor FF value and the leak current Id were obtained by measuring output acquired by using a commercially available solar simulator. A lead wire was soldered to the light-receiving surface electrode 20 to measure the adhesion strength thereof. The adhesion strength was measured by pulling and stripping the lead wire at the angle of 135 degrees by using a commercially available tension testing machine and the adhesion strength was defined as an average value of tensile loads when the lead wire was stripped. The evaluation results are described along with glass compositions in Tables 1 to 3. Nos. 1 to 74 of Tables 1 and 2 denote glass compositions containing Li and Nos. 75 to 113 of Table 3 denote glass compositions without Li. In Tables 1 to 3, those having a triangle added to the number in the "No." field are comparison examples out of the range of the present invention and the others are embodiments within the range of the present invention. Therefore, with regard to the Li-containing systems, Nos. 1, 8, 11 to 14, 23, 24, 29, 51, 65, 69, and 74 are comparison examples and the others are embodiments and, with regard to the Li-free systems, Nos. 75, 82, 83, 86 to 88, 91, 92, 94, and 95 are comparison examples and the others are embodiments. Among those embodiments, those having a circle added to the number in the "No." field are optimum compositions within the range of the present invention as described later. The FF value is a criterion for determining whether a favorable ohmic contact is acquired and, although it is considered that a solar cell is usable if the FF value is equal to or greater than 70, a higher FF value is naturally more preferable and the embodiments having an FF value greater than 75 are considered as passing. A lower leak current Id is more preferable and the leak current is a criterion for determining whether the electrode penetrates into the p-n junction. The leak current Id is indicated by a double circle when a numerical value at 10 (V) is 0.1 (A) or less, by a circle when the value is 0.2 (A) or less, by a triangle when the value is 0.5 (A) or less, or by a cross mark when the value is 0.5 (A) or greater.

TABLE 1

| No. | mol RATIO Pb/Si | COMPOSITIONS (mol %) | | | | | | | | | | DETERMINATION FF | Id | DETERMINATION RESULTS OUTPUT CHARACTERISTICS | ADHESION STRENGTH (N) |
| --- | --- | --- | --- | --- | --- | --- | --- | --- | --- | --- | --- | --- | --- | --- | --- |
| | | PbO | $B_2O_3$ | $SiO_2$ | $Al_2O_3$ | $Li_2O$ | $TiO_2$ | ZnO | $ZrO_2$ | $P_2O_5$ | $SO_2$ | | | | |
| ▲ | 1.27 | 40.8 | 6.6 | 32.2 | 3.0 | 12.0 | 3.0 | — | 0.4 | 2.0 | — | 77 | ○ | ○ | 2.5 |
| 2 | 1.27 | 40.8 | 6.55 | 32.2 | 3.0 | 12.0 | 3.0 | — | 0.4 | 2.0 | 0.05 | 77 | ○ | ○ | 3 |
| ③ | 1.27 | 40.8 | 6.5 | 32.2 | 3.0 | 12.0 | 3.0 | — | 0.4 | 2.0 | 0.1 | 77 | ○ | ○ | 4 |
| ④ | 1.27 | 40.8 | 6.1 | 32.2 | 3.0 | 12.0 | 3.0 | — | 0.4 | 2.0 | 0.5 | 77 | ○ | ○ | 5 |
| ⑤ | 1.27 | 40.3 | 6.0 | 31.8 | 3.0 | 12.0 | 3.0 | — | 0.4 | 2.0 | 1.5 | 78 | ○ | ○ | 6 |

TABLE 1-continued

| No. | mol RATIO Pb/Si | PbO | B$_2$O$_3$ | SiO$_2$ | Al$_2$O$_3$ | Li$_2$O | TiO$_2$ | ZnO | ZrO$_2$ | P$_2$O$_5$ | SO$_2$ | DETERMINATION FF | Id | OUTPUT CHARACTERISTICS | ADHESION STRENGTH (N) |
|---|---|---|---|---|---|---|---|---|---|---|---|---|---|---|---|
| ⑥ | 1.27 | 39.8 | 5.9 | 31.4 | 3.0 | 12.0 | 3.0 | — | 0.4 | 2.0 | 2.5 | 78 | ⊚ | ○ | 5 |
| 7 | 1.27 | 39.8 | 4.0 | 31.4 | 2.7 | 12.0 | 2.7 | — | 0.4 | 2.0 | 5.0 | 75 | ⊚ | ○ | 4 |
| 8 | 1.27 | 39.8 | 4.0 | 31.4 | 1.7 | 12.0 | 1.7 | — | 0.4 | 2.0 | 7.0 | 72 | ⊚ | X | 4 |
| ⑨ | 1.27 | 38.0 | 8.0 | 30.0 | 3.0 | 12.0 | 3.0 | 5.0 | — | — | 1.0 | 77 | ○ | ○ | 5 |
| 10 | 1.27 | 39.1 | 8.1 | 30.8 | 0.5 | 12.0 | 3.0 | — | — | 6.0 | 0.5 | 75 | △ | ○ | 4 |
| 11 | 1.31 | 41.9 | 6.0 | 32.1 | — | 12.0 | — | — | — | 7.5 | 0.5 | 73 | X | X | 4 |
| 12 | 0.75 | 32.0 | 6.0 | 42.5 | 3.0 | 12.0 | 3.0 | — | 0.5 | 0.5 | 0.5 | 74 | △ | X | 6 |
| 13 | 0.94 | 16.0 | 18.0 | 17.0 | 3.0 | 12.0 | 3.0 | 30.0 | — | 0.5 | 0.5 | 68 | X | X | 3 |
| 14 | 0.82 | 41.0 | 4.0 | 50.0 | — | 3.0 | — | — | 0.5 | 1.0 | 0.5 | 72 | △ | X | 5 |
| 15 | 0.81 | 38.0 | 4.0 | 47.0 | — | 3.0 | — | — | 0.5 | 1.0 | 0.5 | 75 | △ | ○ | 5 |
| 16 | 0.90 | 18.0 | 18.0 | 20.0 | 3.0 | 10.0 | 3.0 | 27.0 | — | 0.5 | 0.5 | 75 | △ | ○ | 3 |
| ⑰ | 0.91 | 32.0 | 8.0 | 35.0 | 3.0 | 12.0 | 3.0 | 6.0 | — | 0.5 | 0.5 | 77 | △ | ○ | 5 |
| ⑱ | 0.91 | 32.0 | 8.0 | 35.0 | — | 12.0 | 6.0 | 6.0 | — | 0.5 | 0.5 | 77 | △ | ○ | 5 |
| ⑲ | 1.00 | 32.0 | 12.0 | 32.0 | 3.0 | 12.0 | 3.0 | 5.0 | — | 0.5 | 0.5 | 77 | ○ | ○ | 4 |
| 20 | 1.76 | 51.0 | 6.0 | 29.0 | — | 12.0 | — | — | 0.5 | 0.5 | 1.0 | 76 | △ | ○ | 5 |
| 21 | 1.96 | 53.0 | 6.0 | 27.0 | — | 12.0 | — | — | 0.5 | 0.5 | 1.0 | 75 | △ | ○ | 5 |
| 22 | 2.29 | 64.0 | 4.0 | 28.0 | — | 1.0 | — | 1.0 | 0.5 | 1.0 | 0.5 | 75 | △ | ○ | 4 |
| 23 | 2.32 | 65.0 | 4.0 | 28.0 | — | 1.0 | — | — | 0.5 | 1.0 | 0.5 | 73 | △ | X | 4 |
| 24 | 1.89 | 64.0 | — | 33.9 | — | 1.0 | — | — | 0.5 | 0.5 | 0.1 | 73 | △ | X | 3 |
| 25 | 1.83 | 63.0 | 1.0 | 34.4 | — | 1.0 | — | — | 0.5 | 0.5 | 0.1 | 75 | △ | ○ | 3 |
| 26 | 1.68 | 61.0 | 1.0 | 36.4 | — | 1.0 | — | — | 0.5 | 0.5 | 0.1 | 76 | ○ | ○ | 4 |
| 27 | 1.00 | 20.0 | 18.0 | 20.0 | 3.0 | 10.0 | 3.0 | 25.0 | — | 0.5 | 0.5 | 75 | △ | ○ | 3 |
| 28 | 1.33 | 20.0 | 18.0 | 15.0 | 3.0 | 12.0 | 3.0 | 26.5 | — | 2.0 | 0.5 | 75 | △ | ○ | 3 |
| 29 | 1.33 | 20.0 | 21.0 | 15.0 | 3.0 | 12.0 | 3.0 | 23.5 | — | 2.0 | 0.5 | 72 | X | X | 3 |
| 30 | 2.18 | 48.0 | 4.0 | 22.0 | 18.0 | 6.0 | — | — | — | 1.0 | 1.0 | 75 | △ | ○ | 4 |
| 31 | 1.90 | 40.0 | 4.0 | 21.0 | 3.0 | 12.0 | 18.0 | — | 0.5 | 1.0 | 0.5 | 75 | ○ | ○ | 4 |
| 32 | 1.75 | 35.0 | 4.0 | 20.0 | 3.0 | 6.0 | — | 30.0 | 0.5 | 1.0 | 0.5 | 76 | ○ | ○ | 5 |
| ㉝ | 1.27 | 38.0 | 8.0 | 30.0 | 3.0 | 12.0 | 3.0 | 3.5 | — | — | 2.5 | 77 | ○ | ○ | 6 |
| ㉞ | 1.27 | 38.0 | 8.0 | 30.0 | 3.0 | 12.0 | 3.0 | 2.5 | — | 1.0 | 2.5 | 78 | ⊚ | ○ | 6 |
| ㉟ | 1.19 | 38.0 | 6.0 | 32.0 | 3.0 | 12.0 | 3.0 | 2.5 | — | 1.0 | 2.5 | 77 | ○ | ○ | 6 |
| ㊱ | 1.27 | 38.0 | 8.0 | 30.0 | — | 12.0 | 3.0 | 5.0 | 0.5 | 1.0 | 2.5 | 77 | ⊚ | ○ | 6 |
| ㊲ | 1.81 | 47.0 | 6.0 | 26.0 | 6.0 | 6.0 | — | 5.0 | 0.5 | 2.0 | 1.5 | 77 | ○ | ○ | 5 |
| ㊳ | 1.61 | 45.0 | 6.0 | 28.0 | 6.0 | 6.0 | — | 5.0 | 0.5 | 2.0 | 1.5 | 78 | ⊚ | ○ | 5 |
| ㊴ | 1.83 | 42.0 | 6.0 | 23.0 | 8.0 | 6.0 | — | 11.0 | 0.5 | 2.0 | 1.5 | 78 | ⊚ | ○ | 5 |
| ㊵ | 1.74 | 40.0 | 6.0 | 23.0 | 8.0 | 6.0 | — | 13.0 | 0.5 | 2.0 | 1.5 | 78 | ⊚ | ○ | 5 |
| ㊶ | 1.65 | 38.0 | 6.0 | 23.0 | 8.0 | 6.0 | — | 15.0 | 0.5 | 2.0 | 1.5 | 77 | ○ | ○ | 5 |
| ㊷ | 2.18 | 48.0 | 6.0 | 22.0 | 6.0 | 1.0 | — | 13.0 | 0.5 | 2.0 | 1.5 | 77 | ○ | ○ | 5 |
| ㊸ | 1.92 | 46.0 | 6.0 | 24.0 | 6.0 | 1.0 | — | 13.0 | 0.5 | 2.0 | 1.5 | 78 | ⊚ | ○ | 5 |
| ㊹ | 1.69 | 44.0 | 6.0 | 26.0 | 6.0 | 1.0 | — | 13.0 | 0.5 | 2.0 | 1.5 | 77 | ○ | ○ | 5 |
| 45 | 1.97 | 59.0 | 4.0 | 30.0 | — | 1.0 | — | — | — | 1.0 | 5.0 | 75 | ○ | ○ | 6 |
| 46 | 1.97 | 61.0 | 4.0 | 31.0 | 0.5 | 1.0 | — | 1.5 | 0.5 | — | 0.5 | 76 | ○ | ○ | 4 |

TABLE 2

| No. | mol RATIO Pb/Si | PbO | B$_2$O$_3$ | SiO$_2$ | Al$_2$O$_3$ | Li$_2$O | TiO$_2$ | ZnO | ZrO$_2$ | P$_2$O$_5$ | SO$_2$ | DETERMINATION FF | Id | OUTPUT CHARACTERISTICS | ADHESION STRENGTH (N) |
|---|---|---|---|---|---|---|---|---|---|---|---|---|---|---|---|
| 47 | 1.37 | 48.0 | 4.0 | 35.0 | — | 0.6 | 3.0 | 7.4 | — | 1.0 | 1.0 | 75 | ○ | ○ | 5 |
| 48 | 1.37 | 56.0 | 1.0 | 41.0 | — | 1.0 | — | — | 0.5 | 0.5 | 0.5 | 75 | △ | ○ | 4 |
| ㊾ | 1.27 | 38.0 | 6.0 | 30.0 | 3.0 | 15.0 | 3.0 | 3.0 | — | 1.0 | 1.0 | 77 | ○ | ○ | 5 |
| 50 | 1.27 | 38.0 | 6.0 | 30.0 | 3.0 | 18.0 | 3.0 | — | — | 1.0 | 1.0 | 75 | △ | ○ | 5 |
| 51 | 1.27 | 38.0 | 6.0 | 30.0 | 3.0 | 21.0 | — | — | — | 1.0 | 1.0 | 71 | △ | X | 5 |
| 52 | 2.10 | 42.0 | 15.0 | 20.0 | 1.0 | 3.0 | 3.0 | 14.0 | 0.5 | 1.0 | 0.5 | 76 | ○ | ○ | 4 |
| ㊼ | 1.91 | 42.0 | 12.0 | 22.0 | 1.0 | 3.0 | 3.0 | 14.5 | 0.5 | 1.0 | 1.0 | 77 | ○ | ○ | 5 |
| ㊾ | 1.43 | 40.0 | 12.0 | 28.0 | 4.0 | 12.0 | — | — | 0.5 | 2.0 | 1.5 | 78 | ○ | ○ | 5 |
| ㊿ | 1.61 | 45.0 | 3.0 | 28.0 | 3.0 | 6.0 | 3.0 | 8.0 | 0.5 | 2.0 | 1.5 | 77 | ○ | ○ | 5 |
| 56 | 1.46 | 38.0 | 6.0 | 26.0 | 7.0 | 6.0 | — | 13.0 | 0.5 | 2.0 | 1.5 | 78 | ⊚ | ○ | 5 |
| 57 | 1.91 | 42.0 | 4.0 | 22.0 | 7.0 | 6.0 | 3.0 | 10.5 | — | 3.0 | 2.5 | 78 | ⊚ | ○ | 6 |
| 58 | 2.14 | 47.0 | 6.0 | 22.0 | 6.0 | 6.0 | — | 8.0 | 0.5 | 2.0 | 2.5 | 78 | ⊚ | ○ | 6 |
| 59 | 2.30 | 46.0 | 6.0 | 20.0 | 6.0 | 6.0 | 3.0 | 7.5 | 0.5 | 2.0 | 3.0 | 78 | ⊚ | ○ | 6 |
| 60 | 0.80 | 28.0 | 6.0 | 35.0 | 3.0 | 12.0 | 3.0 | 11.0 | 0.5 | 1.0 | 0.5 | 77 | ○ | ○ | 4 |
| 61 | 0.81 | 22.0 | 9.0 | 27.0 | 3.0 | 15.0 | 3.0 | 15.5 | 0.5 | 4.0 | 1.0 | 77 | ⊚ | ○ | 5 |
| 62 | 1.65 | 38.0 | 8.0 | 23.0 | 12.0 | 12.0 | — | 5.0 | 0.5 | 1.0 | 0.5 | 77 | △ | ○ | 6 |
| 63 | 1.65 | 38.0 | 8.0 | 23.0 | 15.0 | 12.0 | — | 2.0 | 0.5 | 1.0 | 0.5 | 76 | △ | ○ | 6 |

TABLE 2-continued

| No. | mol RATIO Pb/Si | PbO | B$_2$O$_3$ | SiO$_2$ | Al$_2$O$_3$ | Li$_2$O | TiO$_2$ | ZnO | ZrO$_2$ | P$_2$O$_5$ | SO$_2$ | DETERMINATION FF | Id | OUTPUT CHARACTERISTICS | ADHESION STRENGTH (N) |
|---|---|---|---|---|---|---|---|---|---|---|---|---|---|---|---|
| 64 | 1.65 | 38.0 | 5.0 | 23.0 | 18.0 | 12.0 | — | 2.0 | 0.5 | 1.0 | 0.5 | 75 | Δ | ◯ | 6 |
| 65 | 1.65 | 38.0 | 4.0 | 23.0 | 21.0 | 12.0 | — | — | 0.5 | 1.0 | 0.5 | 73 | X | X | 6 |
| 66 | 1.52 | 38.0 | 6.0 | 25.0 | 3.0 | 12.0 | 12.0 | 2.0 | 0.5 | 1.0 | 0.5 | 77 | ⊚ | ◯ | 5 |
| 67 | 1.52 | 38.0 | 6.0 | 25.0 | — | 12.0 | 15.0 | 2.0 | 0.5 | 1.0 | 0.5 | 76 | ◯ | ◯ | 4 |
| 68 | 1.52 | 38.0 | 5.0 | 25.0 | — | 12.0 | 18.0 | — | 0.5 | 1.0 | 0.5 | 75 | ◯ | ◯ | 4 |
| 69 | 1.54 | 37.0 | 4.0 | 24.0 | — | 12.0 | 21.0 | — | 0.5 | 1.0 | 0.5 | 73 | ◯ | X | 4 |
| 70 | 0.99 | 40.5 | 3.0 | 41.0 | 3.0 | 12.0 | — | — | 0.4 | — | 0.1 | 76 | Δ | ◯ | 4 |
| 71 | 2.21 | 62.0 | 5.0 | 28.0 | 1.0 | 1.0 | — | — | — | 2.0 | 1.0 | 77 | ⊚ | ◯ | 5 |
| 72 | 2.03 | 61.0 | 4.0 | 30.0 | 0.5 | 1.0 | — | — | 0.5 | 2.0 | 1.0 | 77 | ⊚ | ◯ | 5 |
| 73 | 1.98 | 59.5 | 4.5 | 30.0 | 3.0 | 1.0 | — | — | — | — | 2.0 | 77 | ◯ | ◯ | 6 |
| 74 | 1.65 | 33.0 | 3.0 | 20.0 | 1.0 | 6.0 | — | 35.0 | 0.5 | 1.0 | 0.5 | 74 | ◯ | X | 4 |

TABLE 3

| No. | mol RATIO Pb/Si | PbO | B$_2$O$_3$ | SiO$_2$ | Al$_2$O$_3$ | Li$_2$O | TiO$_2$ | ZnO | ZrO$_2$ | P$_2$O$_5$ | SO$_2$ | DETERMINATION FF | Id | OUTPUT CHARACTERISTICS | ADHESION STRENGTH (N) |
|---|---|---|---|---|---|---|---|---|---|---|---|---|---|---|---|
| 75 | 1.93 | 58.0 | 4.0 | 30.0 | 3.0 | — | — | 3.0 | — | 2.0 | — | 77 | ◯ | ◯ | 2 |
| 76 | 1.93 | 58.0 | 4.0 | 30.0 | 3.0 | — | — | 2.95 | — | 2.0 | 0.05 | 77 | ◯ | ◯ | 3 |
| 77 | 1.93 | 58.0 | 4.0 | 30.0 | 3.0 | — | — | 2.9 | — | 2.0 | 0.1 | 77 | ◯ | ◯ | 4 |
| 78 | 1.93 | 58.0 | 4.0 | 30.0 | 3.0 | — | — | 2.5 | — | 2.0 | 0.5 | 77 | ◯ | ◯ | 5 |
| 79 | 1.93 | 58.0 | 4.0 | 30.0 | 3.0 | — | — | 1.5 | — | 2.0 | 1.5 | 78 | ⊚ | ◯ | 6 |
| 80 | 1.93 | 58.0 | 4.0 | 30.0 | 3.0 | — | — | — | 0.5 | 2.0 | 2.5 | 78 | ⊚ | ◯ | 5 |
| 81 | 1.93 | 58.0 | 4.0 | 30.0 | 1.0 | — | — | — | — | 2.0 | 5.0 | 75 | ⊚ | ◯ | 4 |
| 82 | 1.93 | 58.0 | 3.0 | 30.0 | 1.0 | — | — | — | — | 1.0 | 7.0 | 70 | ⊚ | X | 4 |
| 83 | 2.77 | 72.0 | 1.0 | 26.0 | — | — | — | — | — | 0.5 | 0.5 | 73 | Δ | X | 4 |
| 84 | 2.50 | 70.0 | 1.0 | 28.0 | — | — | — | — | — | 0.5 | 0.5 | 75 | Δ | ◯ | 4 |
| 85 | 1.43 | 50.0 | 4.0 | 35.0 | — | — | 3.0 | 6.0 | — | 1.0 | 1.0 | 75 | Δ | ◯ | 5 |
| 86 | 1.35 | 50.0 | 4.0 | 37.0 | — | — | 3.0 | 4.0 | — | 1.0 | 1.0 | 73 | Δ | X | 5 |
| 87 | 1.37 | 48.0 | 4.0 | 35.0 | — | — | 3.0 | 8.0 | — | 1.0 | 1.0 | 74 | ◯ | X | 5 |
| 88 | 1.33 | 56.0 | 1.0 | 42.0 | — | — | — | — | — | 0.5 | 0.5 | 70 | X | X | 4 |
| 89 | 1.45 | 58.0 | 1.0 | 40.0 | — | — | — | — | — | 0.5 | 0.5 | 75 | Δ | ◯ | 4 |
| 90 | 2.50 | 50.0 | 8.0 | 20.0 | 1.0 | — | 9.0 | 10.0 | — | 1.0 | 1.0 | 75 | ◯ | ◯ | 4 |
| 91 | 2.78 | 50.0 | 8.0 | 18.0 | 3.0 | — | 9.0 | 10.0 | — | 1.0 | 1.0 | 72 | Δ | X | 4 |
| 92 | 2.41 | 70.0 | — | 29.0 | — | — | — | — | — | 0.5 | 0.5 | 70 | X | X | 4 |
| 93 | 2.00 | 50.0 | 8.0 | 25.0 | — | — | 9.0 | 6.0 | — | 1.0 | 1.0 | 75 | ◯ | ◯ | 5 |
| 94 | 2.00 | 50.0 | 10.0 | 25.0 | — | — | 9.0 | 4.0 | — | 1.0 | 1.0 | 71 | Δ | X | 5 |
| 95 | 2.14 | 60.0 | 4.0 | 28.0 | — | — | — | — | — | 7.5 | 0.5 | 67 | X | X | 4 |
| 96 | 2.14 | 60.0 | 4.0 | 28.0 | — | — | 1.5 | — | 6.0 | 0.5 | — | 75 | ◯ | ◯ | 4 |
| 97 | 2.21 | 62.0 | 4.0 | 28.0 | — | — | 3.5 | — | — | — | 2.5 | 76 | ◯ | ◯ | 6 |
| 98 | 2.21 | 62.0 | 4.0 | 28.0 | 1.0 | — | 2.5 | — | — | — | 2.5 | 76 | ◯ | ◯ | 6 |
| 99 | 1.76 | 58.0 | 4.0 | 33.0 | 1.0 | — | — | — | 0.5 | 2.0 | 1.5 | 77 | ◯ | ◯ | 5 |
| 100 | 1.81 | 58.0 | 4.0 | 32.0 | 1.0 | — | 1.0 | 0.5 | — | 2.0 | 1.5 | 77 | ◯ | ◯ | 5 |
| 101 | 2.18 | 61.0 | 3.0 | 28.0 | 1.0 | — | 1.0 | 1.0 | 1.0 | 2.0 | 2.0 | 78 | ◯ | ◯ | 6 |
| 102 | 2.10 | 61.0 | 3.0 | 29.0 | 0.5 | — | 1.0 | — | 1.0 | 2.0 | 2.5 | 78 | ◯ | ◯ | 6 |
| 103 | 2.05 | 59.5 | 4.0 | 29.0 | — | — | 2.0 | 2.0 | 0.5 | 1.0 | 2.0 | 78 | ◯ | ◯ | 6 |
| 104 | 1.90 | 57.0 | 3.0 | 30.0 | 1.0 | — | 5.0 | — | — | 1.0 | 3.0 | 77 | ⊚ | ◯ | 6 |
| 105 | 1.93 | 58.0 | 6.0 | 30.0 | 1.0 | — | 2.0 | — | — | 2.0 | 1.0 | 78 | ⊚ | ◯ | 5 |
| 106 | 2.14 | 60.0 | 6.0 | 28.0 | 1.0 | — | 2.0 | — | — | 2.0 | 1.0 | 78 | ⊚ | ◯ | 5 |
| 107 | 2.07 | 60.0 | 6.0 | 29.0 | — | — | 2.0 | — | — | 2.0 | 1.0 | 78 | ◯ | ◯ | 5 |
| 108 | 2.10 | 61.0 | 4.0 | 29.0 | 0.5 | — | — | 2.0 | 0.5 | 1.0 | 2.0 | 78 | ⊚ | ◯ | 6 |
| 109 | 1.97 | 61.0 | 4.0 | 31.0 | 0.5 | — | — | — | 0.5 | 1.0 | 2.0 | 77 | ⊚ | ◯ | 6 |
| 110 | 1.79 | 59.0 | 4.0 | 33.0 | 0.5 | — | — | — | 0.5 | 1.0 | 2.0 | 77 | ◯ | ◯ | 6 |
| 111 | 1.81 | 58.0 | 4.0 | 32.0 | 3.0 | — | — | — | — | 2.0 | 1.0 | 77 | ◯ | ◯ | 5 |
| 112 | 1.93 | 58.0 | 4.0 | 30.0 | 5.0 | — | — | — | — | 2.0 | 1.0 | 75 | Δ | ◯ | 5 |
| 113 | 2.11 | 59.0 | 3.0 | 28.0 | 2.5 | — | — | — | 0.5 | 4.0 | 3.0 | 77 | ⊚ | ◯ | 6 |

The samples were fabricated by using a spherical Ag powder having the average particle diameter of 1.6 (μm) and glass frit having the average particle diameter of 1.5 (μm). Preparation proportions were basically 83 (wt %) Ag powder, 5 (wt %) glass frit, 7 (wt %) vehicle, and 5 (wt %) solvent, and the amounts of the vehicle and the solvent were adjusted as needed such that the viscosity at 25 (degrees C.) and 20 (rpm) is set to 200 to 220 (Pa·s) so as to achieve equal printability. A printing plate for forming the light-receiving surface electrode 20 was a SUS325 screen mesh having the wire diameter of 23 (μm) provided with 20-(μm)-thick emulsion. A printing condition was set such that a width dimension of grid lines was set to 80 (μm). Sheet resistance of a substrate was evaluated by using 90±10 (Ω/square).

Tables 1 and 2 describe glasses of a ten-component system $PbO$—$B_2O_3$—$SiO_2$—$Al_2O_3$—$Li_2O$—$TiO_2$—$ZnO$—$ZrO_2$—$P_2O_5$—$SO_2$ acquired by adding $Al_2O_3$, $Li_2O$, $TiO_2$, $ZnO$, $ZrO_2$, $P_2O_5$, and $SO_2$ to $PbO$—$B_2O_3$—$SiO_2$ making up a basic framework and of six- to nine-component systems lacking at least one element of the ten-component system as embodiments.

Nos. 1 to 8 were examined in terms of the amount of S in the nine-component system lacking Zn. In the composition with Pb/Si at 1.27, PbO from 39.8 to 40.8 (mol %), $B_2O_3$ from 4.0 to 6.6 (mol %), $SiO_2$ from 31.4 to 32.2 (mol %), $Al_2O_3$ from 1.7 to 3.0 (mol %), $Li_2O$ at 12.0 (mol %), $TiO_2$ from 1.7 to 3.0 (mol %), $ZrO_2$ at 0.4 (mol %), and $P_2O_5$ at 2.0 (mol %), when the amount of $SO_2$ was set to 0 to 7.0 (mol %), the FF value of 75 or more and the leak current Id of 0.2 (A) or less were acquired when $SO_2$ was in the range of 5.0 (mol %) or less. The adhesion strength of 3 (N) or more was acquired when $SO_2$ was in the range of 0.05 (mol %) or more. This evaluation result reveals that the light-receiving surface electrode 20 with excellent output characteristics and high adhesion strength is acquired by setting $SO_2$ within the range of 0.05 to 5.0 (mol %). It is considered from the characteristics that the amount of $SO_2$ is preferably within the range of 0.5 to 2.5 (mol %).

Nos. 9 to 11 were examined in terms of the amount of P in the six- to eight-component systems lacking Zr. In the composition with Pb/Si from 1.27 to 1.31, PbO from 38.0 to 41.9 (mol %), $B_2O_3$ from 6.0 to 8.1 (mol %), $SiO_2$ from 30.0 to 32.1 (mol %), $Al_2O_3$ from 0 to 3.0 (mol %), $Li_2O$ at 12.0 (mol %), $TiO_2$ from 0 to 3.0 (mol %), ZnO from 0 to 5.0 (mol %), and $SO_2$ from 0.5 to 1.0 (mol %), when $P_2O_5$ was set to 0 to 7.5 (mol %), the FF value of 75 or more and the leak current Id of 0.5 (A) or less were acquired at the amount of P within the range of 6.0 (mol %) or less. When the amount of P reaches 7.5 (mol %), the FF value decreases to 73 and the leak current Id increases to 0.5 (A) or more. P is not an essential component because sufficient characteristics are acquired at 0 (mol %). It is considered from this evaluation result that P within the range of 0 to 6.0 (mol %) is appropriate.

Nos. 12 to 23 were examined in terms of the amounts of Pb and Si and the Pb/Si ratio. The evaluation was performed within the composition ranges of Pb/Si from 0.75 to 2.32, PbO from 16.0 to 65.0 (mol %), $B_2O_3$ from 4.0 to 18.0 (mol %), $SiO_2$ from 17.0 to 50.0 (mol %), $Al_2O_3$ from 0 to 3.0 (mol %), $Li_2O$ from 1.0 to 12.0 (mol %), $TiO_2$ from 0 to 6.0 (mol %), ZnO from 0 to 30.0 (mol %), $ZrO_2$ from 0 to 0.5 (mol %), $P_2O_5$ from 0.5 to 1.0 (mol %), and $SO_2$ from 0.5 to 1.0 (mol %). When Pb/Si is 0.75 or 2.32, the FF value is 73 to 74, remaining in insufficient characteristics. The leak current Id is 0.5 (A) or less, which is less preferable. When the amount of Pb is 16 (mol %), the FF value is as low as 68 and the leak current Id is as large as 0.5 (A) or more. When the amount of Pb is 65 (mol %), the FF value is as low as 73. When the amount of Si is 50 (mol %), the FF value is as low as 72 and the leak current Id is 0.5 (A) or less, which is less preferable. From these results, it can be said that the amount of Pb, the amount of Si, and the Pb/Si ratio are preferably within the ranges of 18 to 64 (mol %), 47 (mol %) or less, and 0.8 to 2.3, respectively.

Nos. 24 to 29 were examined in terms of the amount of B. In the composition ranges of Pb/Si from 1.00 to 1.89, PbO from 20.0 to 64.0 (mol %), $SiO_2$ from 15.0 to 36.4 (mol %), $Al_2O_3$ from 0 to 3.0 (mol %), $Li_2O$ from 1.0 to 12.0 (mol %), $TiO_2$ from 0 to 3.0 (mol %), ZnO from 0 to 26.5 (mol %), $ZrO_2$ from 0 to 0.5 (mol %), $P_2O_5$ from 0.5 to 2.0 (mol %), and $SO_2$ from 0.1 to 0.5 (mol %), $B_2O_3$ was set to 0 to 21.0 (mol %) for evaluation. In the composition without B, the FF value is as low as 73 and the leak current Id is 0.5 (A) or less, remaining in insufficient characteristics. When the amount of B reaches 21 (mol %), the FF value is 72 and the leak current Id is 0.5 (A) or more, which is insufficient. From this result, the amount of B is preferably within the range of 1 to 18 (mol %). Even when the amount of Si is 15 (mol %), the FF value is as high as 75, and it is considered that the amount of Si of 15 (mol %) or more is sufficient.

Nos. 30 to 32 were examined in terms of the acceptable ranges of Al, Ti, and Zn and were evaluated within the composition ranges of Pb/Si from 0.75 to 2.18, PbO from 35.0 to 48.0 (mol %), $B_2O_3$ at 4.0 (mol %), $SiO_2$ from 20.0 to 22.0 (mol %), $Al_2O_3$ from 3.0 to 18.0 (mol %), $Li_2O$ from 6.0 to 12.0 (mol %), $TiO_2$ from 0 to 18.0 (mol %), ZnO from 0 to 30.0 (mol %), $ZrO_2$ from 0 to 0.5 (mol %), $P_2O_5$ at 1.0 (mol %), and $SO_2$ from 0.5 to 1.0 (mol %). Even when the amounts of Al, Ti, and Zn are 18 (mol %), 18 (mol %), and 30 (mol %), respectively, the results of the FF value are acquired as 75, 75, and 76, respectively. As also indicated by other evaluation results, it is considered that Al, Ti, and Zn can be contained within the ranges of 18 (mol %) or less, 18 (mol %) or less, and 30 (mol %) or less, respectively, although these are optional components.

Nos. 33 to 44 are an example of an optimum composition range. Nos 33 to 36 were evaluated within the composition ranges of Pb/Si from 1.19 to 2.27, PbO at 38.0 (mol %), $B_2O_3$ from 6.0 to 8.0 (mol %), $SiO_2$ from 30.0 to 32.0 (mol %), $Al_2O_3$ from 0 to 3.0 (mol %), $Li_2O$ at 12.0 (mol %), $TiO_2$ at 3.0 (mol %), ZnO from 2.5 to 5.0 (mol %), $ZrO_2$ from 0 to 0.5 (mol %), $P_2O_5$ from 0 to 1.0 (mol %), and $SO_2$ at 2.5 (mol %). In other words, the optimum composition in the case of 12.0 (mol %) Li was examined. In a system containing Ti at 3.0 (mol %) and S at 2.5 (mol %), even the composition lacking P and the composition lacking Al achieve extremely high characteristics with the FF value of 77 or more, the leak current Id of 0.2 (A) or less, and the adhesion strength of 6 (N) or more.

Nos. 37 to 41 were evaluated in the system lacking Ti for the composition ranges of Pb/Si from 1.65 to 1.83, PbO from 38.0 to 47.0 (mol %), $B_2O_3$ at 6.0 (mol %), $SiO_2$ from 23.0 to 28.0 (mol %), $Al_2O_3$ from 6.0 to 8.0 (mol %), $Li_2O$ at 6.0 (mol %), ZnO from 5 to 15.0 (mol %), $ZrO_2$ at 0.5 (mol %), $P_2O_5$ at 2.0 (mol %), and $SO_2$ at 1.5 (mol %). In other words, the optimum composition in the case of 6.0 (mol %) Li was examined. Even the composition lacking Ti achieves extremely high characteristics with the FF value of 77 or more, the leak current Id of 0.2 (A) or less, and the adhesion strength of 5 (N) or more.

Nos 42 to 44 were evaluated in the system lacking Ti for the composition ranges of Pb/Si from 1.69 to 2.18, PbO from 44.0 to 48.0 (mol %), $B_2O_3$ at 6.0 (mol %), $SiO_2$ from 22.0 to 26.0 (mol %), $Al_2O_3$ at 6.0 (mol %), $Li_2O$ at 1.0 (mol %), ZnO at 13.0 (mol %), $ZrO_2$ at 0.5 (mol %), $P_2O_5$ at 2.0 (mol %), and $SO_2$ at 1.5 (mol %). In other words, the optimum composition in the case of 1.0 (mol %) Li was examined. Even the composition lacking Ti and containing Li at 1.0 (mol %) achieves extremely high characteristics with the FF value of 77 or more, the leak current Id of 0.2 (A) or less, and the adhesion strength of 5 (N) or more.

Nos. 45 and 46 were evaluated in terms of the upper limit of the amount of S and a system without P, respectively, in the composition containing Li at 1.0 (mol %). No. 45 reveals that even when S is as large as 5.0 (mol %), high characteristics are achieved as the FF value of 75, the leak current Id of 0.2 (A) or less, and the adhesion strength of 6 (N). No. 46 reveals that the system lacking both Ti and P has no problem achieving sufficiently high characteristics with the FF value of 76, the leak current Id of 0.2 (A) or less, and the adhesion strength of 4 (N).

Nos. 47 to 51 of Table 2 were examined in terms of an appropriate range of the amount of Li in the system lacking Zr. The evaluation was performed within the composition ranges of Pb/Si from 1.27 to 1.37, PbO from 38.0 to 56.0 (mol %), $B_2O_3$ from 1.0 to 6.0 (mol %), $SiO_2$ from 30.0 to 41.0 (mol %), $Al_2O_3$ from 0 to 3.0 (mol %), $Li_2O$ from 0.6 to 21.0 (mol %), $TiO_2$ from 0 to 3.0 (mol %), ZnO from 0 to 7.4 (mol %), $P_2O_5$ from 0.5 to 1.0 (mol %), and $SO_2$ from 0.5 to 1.0 (mol %). When Li is within the range of 0.6 to 18 (mol %), sufficient characteristics are achieved as the FF value of 75 or more, the leak current Id of 0.5 (A) or less, and the adhesion strength of 4 (N) or more; however, when Li reaches 21 (mol %), the FF value decreases to 71 and the output characteristics become insufficient. From this result, Li within the range of 0.6 to 18 (mol %) is appropriate.

Nos. 52 to 65 were further examined in terms of the appropriate amounts of the components. Nos. 52 to 54 were examined in terms of the upper limit of the amount of B and, in the composition ranges of Pb/Si from 1.43 to 2.10, PbO from 40.0 to 42.0 (mol %), $B_2O_3$ from 12.0 to 15.0 (mol %), $SiO_2$ from 20.0 to 28.0 (mol %), $Al_2O_3$ from 1.0 to 4.0 (mol %), $Li_2O$ from 3.0 to 12.0 (mol %), $TiO_2$ from 0 to 3.0 (mol %), ZnO from 0 to 14.5 (mol %), $ZrO_2$ at 0.5 (mol %), $P_2O_5$ from 1.0 to 2.0 (mol %), and $SO_2$ from 0.5 to 1.5 (mol %), favorable results were acquired as the leak current Id equal to or less than 0.2 (A). Particularly, when the amount of B is 12.0 (mol %), the FF value is 77 or more and the adhesion strength is 5 (N), which is more preferable. Therefore, although acceptable up to 18.0 (mol %), the amount of B is preferably 15.0 (mol %) or less and more preferably 12.0 (mol %) or less.

Nos. 55 to 59 were examined in terms of the optimum composition in the case of the amount of Li of 6.0 (mol %) as is the case with Nos. 37 to 41 and, in the composition ranges of Pb/Si from 1.46 to 2.30, PbO from 38.0 to 47.0 (mol %), $B_2O_3$ from 3.0 to 6.0 (mol %), $SiO_2$ from 20.0 to 28.0 (mol %), $Al_2O_3$ from 3.0 to 7.0 (mol %), $Li_2O$ at 6.0 (mol %), $TiO_2$ from 0 to 3.0 (mol %), ZnO from 7.5 to 13.0 (mol %), $ZrO_2$ from 0 to 0.5 (mol %), $P_2O_5$ from 2.0 to 3.0 (mol %), and $SO_2$ from 1.5 to 3.0 (mol %), extremely favorable results were acquired as the FF value of 77 or more, the leak current Id of 0.2 (A) or less, and the adhesion strength of 5 (N) or more. Among these, Nos. 56 to 59 having the amount of B equal to or greater than 4.0 (mol %) and the amount of Al equal to or greater than 6.0 (mol %) achieved higher results with the FF value of 78 and the leak current Id of 0.1 (A) or less.

Nos. 60 and 61 were examined in terms of the lower limit value of the Pb/Si ratio. In the composition ranges of Pb/Si from 0.80 to 0.81, PbO from 22.0 to 28.0 (mol %), $B_2O_3$ from 6.0 to 9.0 (mol %), $SiO_2$ from 27.0 to 35.0 (mol %), $Al_2O_3$ at 3.0 (mol %), $Li_2O$ from 12.0 to 15.0 (mol %), $TiO_2$ at 3.0 (mol %), ZnO from 11.0 to 15.5 (mol %), $ZrO_2$ at 0.5 (mol %), $P_2O_5$ from 1.0 to 4.0 (mol %), and $SO_2$ from 0.5 to 1.0 (mol %), it was confirmed that favorable results were acquired as the FF value of 77, the leak current Id of 0.2 (A) or less, and the adhesion strength of 4 (N) or more.

Nos. 62 to 65 were examined in terms of the upper limit of the amount of Al in the composition lacking Ti. In evaluation within the composition ranges of Pb/Si at 1.65, PbO at 38.0 (mol %), $B_2O_3$ from 4.0 to 8.0 (mol %), $SiO_2$ at 23.0 (mol %), $Al_2O_3$ from 12.0 to 21.0 (mol %), $Li_2O$ at 12.0 (mol %), ZnO from 0 to 5.0 (mol %), $ZrO_2$ at 0.5 (mol %), $P_2O_5$ at 1.0 (mol %), and $SO_2$ at 0.5 (mol %), Nos. 62 to 64 having the amount of Al of 12.0 to 18.0 (mol %) achieved sufficient results with the FF value of 75 or more, the leak current Id of 0.5 (A) or less, and the adhesion strength of 6 (N). No. 65 having the amount of Al of 21.0 (mol %) caused an insufficient result with the FF value of 73 and the leak current Id of 0.5 (A) or more. Therefore, the amount of Al must be limited to 18 (mol %) or less. Since a larger amount of Al tends to make the FF value lower, it is considered that a smaller amount of Al is more preferable.

Nos. 66 to 69 were examined in terms of the upper limit of the amount of Ti. In evaluation within the composition ranges of Pb/Si from 1.52 to 1.54, PbO from 37.0 to 38.0 (mol %), $B_2O_3$ from 4.0 to 6.0 (mol %), $SiO_2$ from 24.0 to 25.0 (mol %), $Al_2O_3$ from 0 to 3.0 (mol %), $Li_2O$ at 12.0 (mol %), $TiO_2$ from 12.0 to 21.0 (mol %), ZnO from 0 to 2.0 (mol %), $ZrO_2$ at 0.5 (mol %), $P_2O_5$ at 1.0 (mol %), and $SO_2$ at 0.5 (mol %), when Ti was within 18 (mol %), the FF value of 75 or more was acquired; however, when Ti reached 21 (mol %), the FF value was limited to 73. Therefore, the amount of Ti equal to or less than 18 (mol %) is appropriate. Since a larger amount of Ti tends to make the FF value lower, it is considered that a smaller amount of Ti is more preferable.

No. 70 was used for confirming the lower limit value of S in the system lacking P and it was confirmed that the content of 0.1 (mol %) was sufficient. Nos. 71 to 73 are optimum compositions in the vicinity of the lower limit value of the amount of Li in the system lacking $TiO_2$ and ZnO and, within the composition ranges of Pb/Si from 1.98 to 2.21, PbO from 59.5 to 62.0 (mol %), $B_2O_3$ from 4.0 to 5.0 (mol %), $SiO_2$ from 28.0 to 30.0 (mol %), $Al_2O_3$ from 0.5 to 3.0 (mol %), $Li_2O$ at 1.0 (mol %), $ZrO_2$ from 0 to 0.5 (mol %), $P_2O_5$ from 0 to 2.0 (mol %), and $SO_2$ from 1.0 to 2.0 (mol %), favorable results were acquired as the FF value of 77, the leak current Id of 0.2 (A) or less, and the adhesion strength of 5 (N) or more. According to No. 74, when ZnO reaches 35.0 (mol %), the FF value decreases to 74 and the characteristics cannot be acquired. Considering together with the result of No. 30 described above, the amount of ZnO must be limited to 30 (mol %) or less.

In the range of the embodiments, optimum compositions are Nos. 33 to 44, Nos. 53 to 62, etc., having a circle added to the "No." field and are within ranges of Pb/Si from 0.80 to 2.30, Pb from 22.0 to 48.0 (mol %), B from 3.0 to 12.0 (mol %), Si from 22.0 to 35.0 (mol %), Al from 0 to 12.0 (mol %), Li from 1.0 to 12.0 (mol %), Ti from 0 to 3.0 (mol %), Zn from 0 to 15.5 (mol %), Zr from 0 to 0.5 (mol %), P from 0 to 4.0 (mol %), and S from 0.5 to 3.0 (mol %). In these ranges, extremely high characteristics are acquired as the FF value of 77 or more, the leak current Id of 0.5 (A) or less, and the adhesion strength of 4 (N) or more.

From the results described above, the Li-containing system is preferably set within the ranges of the Pb/Si ratio from 0.8 to 2.3, Pb from 18 to 64 (mol %), B from 1 to 18 (mol %), Si from 15 to 47 (mol %), Li from 0.6 to 18 (mol %), and S from 0.05 to 5.0 (mol %) and, with regard to arbitrary components, Al, Ti, Zn, and Zr are preferably limited to 18 (mol %) or less, 18 (mol %) or less, 30 (mol %) or less, and 0.5 (mol %) or less, respectively.

In Table 3 of the Li-free system, Nos. 75 to 82 are examined in terms of a range of the amount of S in the system lacking Ti. The evaluation was performed within the composition ranges of Pb/Si at 1.93, PbO at 58.0 (mol %), $B_2O_3$ from 3.0 to 4.0 (mol %), $SiO_2$ at 30.0 (mol %), $Al_2O_3$ from 1.0 to 3.0 (mol %), ZnO from 0 to 3.0 (mol %), $ZrO_2$ from 0 to 0.5 (mol %), $P_2O_5$ from 1.0 to 2.0 (mol %), and $SO_2$ from 0 to 7.0 (mol %). In these composition ranges, if $SO_2$ is equal to or less than 5.0 (mol %), favorable output characteristics are acquired as the FF value of 75 or more and the leak current Id of 0.2 (A) or less and, if $SO_2$ is equal to or greater than 0.05 (mol %), the sufficient adhesion strength of 3 (N) or more is acquired. At 7.0 (mol %), the FF value is limited to 70 while, at 0 (mol %), the adhesion strength is limited to 2 (N), and the both cases are insufficient. Therefore, $SO_2$ within the range of 0.05 to 5.0 satisfies both the output characteristics and the adhesion strength.

Nos. 83 to 87 were examined in terms of the amounts of Pb and Si and the Pb/Si ratio in the system lacking Al and Zr and were evaluated within the composition ranges of Pb/Si from 1.35 to 2.77, PbO from 48.0 to 72.0 (mol %), $B_2O_3$ from 1.0 to 4.0 (mol %), $SiO_2$ from 26.0 to 37.0 (mol %), $TiO_2$ from 0 to 3.0 (mol %), ZnO from 0 to 8.0 (mol %), $P_2O_5$ from 0.5 to 1.0 (mol %), and $SO_2$ from 0.5 to 1.0 (mol %). No. 83 contains high Pb of 72 (mol %) and has a large Pb/Si ratio of 2.77 and the FF value is limited to 73. The leak current Id is equal to or less than 0.5 (A). No. 86 has a small Pb/Si ratio of 1.35 and the FF value is limited to 73. No. 87 contains low Pb of 48 (mol %) and has a small Pb/Si ratio of 1.37 and the FF value is limited to 74. Nos. 84 and 85 having the Pb/Si ratio from 1.43 to 2.50 and the amount of Pb from 50 to 70 (mol %) have the sufficiently large FF value of 75. From these results, the preferred ranges of the Pb/Si ratio and the amount of Pb are 1.4 to 2.5 and 50 to 70 (mol %), respectively.

Nos. 88 to 91 were examined in terms of the amount of Si in the system lacking Zr and were evaluated within the composition ranges of Pb/Si from 1.33 to 2.78, PbO from 50.0 to 58.0 (mol %), $B_2O_3$ from 1.0 to 8.0 (mol %), $SiO_2$ from 18.0 to 42.0 (mol %), $Al_2O_3$ from 0 to 3.0 (mol %), $TiO_2$ from 0 to 9.0 (mol %), ZnO from 0 to 10.0 (mol %), $P_2O_5$ from 0.5 to 1.0 (mol %), and $SO_2$ from 0.5 to 1.0 (mol %). Although No. 88 containing Si at 42 (mol %) has a small FF value of 70 and No. 91 containing Si at 18 (mol %) has a small FF value of 72, Nos. 89 and 90 containing Si at 20 to 40 (mol %) achieve an FF value of 75, which is a sufficient value. From these results, the preferred ranges of the amount of Si is 20 to 40 (mol %).

Nos. 92 to 94 were examined in terms of the amount of B in the system lacking Al and Zr and were evaluated within the composition ranges of Pb/Si from 2.00 to 2.41, PbO from 50.0 to 70.0 (mol %), $B_2O_3$ from 0 to 10.0 (mol %), $SiO_2$ from 25.0 to 29.0 (mol %), $TiO_2$ from 0 to 9.0 (mol %), ZnO from 0 to 6.0 (mol %), $P_2O_5$ from 0.5 to 1.0 (mol %), and $SO_2$ from 0.5 to 1.0 (mol %). No. 92 without B results in a small FF value of 70 and a large leak current Id equal to or greater than 0.5 (A). No. 94 containing high B at 10.0 (mol %) has a small FF value of 71 and the both cases are insufficient. No. 93 containing B at 8.0 (mol %) has an FF value of 75, which is sufficiently high, and the leak current Id is limited to 0.2 (A) or less. In view of these results and the results of Nos. 76 to 90, the amount of B is preferably 1 to 8.0 (mol %).

Nos. 95 to 98 were examined in terms of the amount of P in the system lacking Ti and Zr and were evaluated within the composition ranges of Pb/Si from 2.14 to 2.21, PbO from 60.0 to 62.0 (mol %), $B_2O_3$ at 4.0 (mol %), $SiO_2$ at 28.0 (mol %), $Al_2O_3$ from 0 to 1.0 (mol %), ZnO from 0 to 3.5 (mol %), $P_2O_5$ from 0 to 7.5 (mol %), and $SO_2$ from 0.5 to 2.5 (mol %). Nos. 97 and 98 without P result in the high FF value of 76. Although No. 96 containing the amount of P of 6.0 (mol %) has a sufficiently high FF value of 75, No. 95 containing the high amount of P of 7.5 (mol %) has a significantly reduced FF value limited to 67. From these results, it is considered that P from 0 to 6.0 (mol %) is preferred.

Nos. 99 to 111 and 113 are considered as optimum composition ranges. Among these, No. 99 to 104 were examined in terms of the Pb/Si ratio and the amounts of Pb and Si and were evaluated within the composition ranges of Pb/Si from 1.76 to 2.18, PbO from 57.0 to 61.0 (mol %), $B_2O_3$ from 3.0 to 4.0 (mol %), $SiO_2$ from 28.0 to 33.0 (mol %), $Al_2O_3$ from 0 to 1.0 (mol %), $TiO_2$ from 0 to 5.0 (mol %), ZnO from 0 to 2.0 (mol %), $ZrO_2$ from 0 to 1.0 (mol %), $P_2O_5$ from 1.0 to 2.0 (mol %), and $SO_2$ from 1.5 to 3.0 (mol %). Within these composition ranges, extremely high results are acquired as the FF value of 77 or more, the leak current Id of 0.2 (A) or less, and the adhesion strength of 5 (N) or more. Therefore, high characteristics can be acquired even if the composition lacks one or two of Al, Ti, Zn, and Zr. From the results, the amount of Pb, the amount of Si, and Pb/Si are preferably 57.0 to 61.0 (mol %), 28.0 to 33.0 (mol %), and 2.18 or less, respectively.

Nos. 105 to 107 were examined in terms of the amount of B in the system lacking Zn and Zr and were evaluated within the composition ranges of Pb/Si from 1.93 to 2.07, PbO from 58.0 to 60.0 (mol %), $B_2O_3$ at 6.0 (mol %), $SiO_2$ from 28.0 to 30.0 (mol %), $Al_2O_3$ from 0 to 1.0 (mol %), $TiO_2$ at 2.0 (mol %), $P_2O_5$ at 2.0 (mol %), and $SO_2$ at 1.0 (mol %). Within these composition ranges, extremely high results are acquired as the FF value of 78, the leak current Id of 0.2 (A) or less, and the adhesion strength of 5 (N). Particularly, Nos. 105 and 106 containing Al at 1.0 (mol %) suppresses the leak current Id to 0.1 (A) or less and, therefore, it is considered that a composition containing Al is more preferable. From the results, the amount of B is preferably 6.0 (mol %) or less.

Nos. 108 to 113 were examined in terms of the amounts of Al and P in the system lacking Ti and were evaluated within the composition ranges of Pb/Si from 1.79 to 2.11, PbO from 58.0 to 61.0 (mol %), $B_2O_3$ from 3.0 to 4.0 (mol %), $SiO_2$ from 28.0 to 31.0 (mol %), $Al_2O_3$ from 0.5 to 5.0 (mol %), ZnO from 0 to 2.0 (mol %), $ZrO_2$ from 0 to 0.5 (mol %), $P_2O_5$ from 1.0 to 4.0 (mol %), and $SO_2$ from 1.0 to 3.0 (mol %). Except No. 112, extremely high results are acquired as the FF value of 77 or more, the leak current Id of 0.2 (A) or less, and the adhesion strength of 5 (N) or more. With regard to No. 112, since 5.0 (mol %) of Al is contained, it is considered this is because the amount of Al is somewhat high although within the acceptable range; however, even this composition has the FF value of 75, which is sufficiently high. Compared with No. 111, the amount of Al is preferably equal to or less than 3.0 (mol %). Although No. 113 has the amount of P relatively increased to 4.0 (mol %), the amount to this extent achieves extremely high characteristics and is within the optimum composition range.

From the results described above, the Li-free system is preferably set within the ranges of the Pb/Si ratio from 1.4 to 2.5, Pb from 50 to 70 (mol %), B from 1.0 to 8.0 (mol %), Si from 20.0 to 40.0 (mol %), and S from 0.05 to 5.0 (mol %) and, with regard to arbitrary components, Al, Ti, Zn, Zr, and P are preferably limited to 5.0 (mol %) or less, 10.0 (mol %) or less, 10.0 (mol %) or less, 1.0 (mol %) or less, and 6.0 (mol %) or less, respectively.

Samples of Nos. 114 to 127 of Table 4 correspond to the case of containing $Bi_2O_3$ as glass composition in the conductive paste composition when the light-receiving surface electrode 20 is formed, and are different only in the glass composition as compared to the samples of Tables 1 to 3, and other conditions such as a particle diameter and a mixing proportion of glass frit and a manufacturing method are the same. The samples of Nos. 114 to 120 are of the Li-containing system and specifically are glasses of an eight-component system PbO—$B_2O_3$—$SiO_2$—$Al_2O_3$—$Li_2O$—$P_2O_5$—$Bi_2O_3$—$SO_2$ acquired by adding $Al_2O_3$, $Li_2O$, $P_2O_5$, $Bi_2O_3$, and $SO_2$ to PbO—$B_2O_3$—$SiO_2$, and are evaluated in terms of a fill factor FF value. The samples of Nos. 121 to 127 are glasses of a seven-component system PbO—$B_2O_3$—$SiO_2$—$Al_2O_3$—$P_2O_5$—$Bi_2O_3$—$SO_2$ acquired by adding $Al_2O_3$, $P_2O_5$, $Bi_2O_3$, and $SO_2$ to PbO—$B_2O_3$—$SiO_2$ and are evaluated in terms of a fill factor FF value. In Table 4, those having a triangle added to the number in the "No." field are comparison examples out of the range of the present invention (claim 8) and the others are embodiments within the range of the present invention. Those having a circle added to the number in the "No." field are optimum compositions.

TABLE 4

| No. | mol RATIO Pb/Si | COMPOSITIONS (mol %) | | | | | | | | DETERMINATION FF |
|---|---|---|---|---|---|---|---|---|---|---|
| | | PbO | B$_2$O$_3$ | SiO$_2$ | Al$_2$O$_3$ | Li$_2$O | P$_2$O$_5$ | Bi$_2$O$_3$ | SO$_2$ | |
| 114 | 1.62 | 52.5 | 4.0 | 32.5 | 3.0 | 6.0 | 1.0 | 0.5 | 0.5 | 77 |
| 115 | 1.62 | 52.2 | 4.0 | 32.3 | 3.0 | 6.0 | 1.0 | 1.0 | 0.5 | 78 |
| 116 | 1.62 | 51.0 | 4.0 | 31.5 | 3.0 | 6.0 | 1.0 | 3.0 | 0.5 | 78 |
| 117 | 1.62 | 49.2 | 4.0 | 30.3 | 3.0 | 6.0 | 1.0 | 6.0 | 0.5 | 78 |
| 118 | 1.62 | 45.4 | 4.0 | 28.1 | 3.0 | 6.0 | 1.0 | 12.0 | 0.5 | 76 |
| 119 | 1.62 | 43.6 | 4.0 | 26.9 | 3.0 | 6.0 | 1.0 | 15.0 | 0.5 | 75 |
| 120 | 1.62 | 42.4 | 4.0 | 26.1 | 3.0 | 6.0 | 1.0 | 17.0 | 0.5 | 74 |
| 121 | 2.00 | 60.0 | 4.0 | 30.0 | 3.0 | — | 2.0 | 0.5 | 0.5 | 77 |
| 122 | 2.00 | 59.7 | 4.0 | 29.8 | 3.0 | — | 2.0 | 1.0 | 0.5 | 78 |
| 123 | 2.00 | 58.3 | 4.0 | 29.2 | 3.0 | — | 2.0 | 3.0 | 0.5 | 78 |
| 124 | 2.00 | 56.3 | 4.0 | 28.2 | 3.0 | — | 2.0 | 6.0 | 0.5 | 78 |
| 125 | 2.08 | 53.0 | 4.0 | 25.5 | 3.0 | — | 2.0 | 12.0 | 0.5 | 76 |
| 126 | 2.12 | 51.3 | 4.0 | 24.2 | 3.0 | — | 2.0 | 15.0 | 0.5 | 75 |
| 127 | 2.15 | 50.2 | 4.0 | 23.3 | 3.0 | — | 2.0 | 17.0 | 0.5 | 74 |

Nos. 114 to 127 of Table 4 were examined in terms of an acceptable range of the amount of Bi. In particular, although a solid solution amount of Ag in the glass layer of the electrode-silicon interface must be increased to acquire an ohmic contact, since the increase is limited when Pb is solely used, the solid solution amount of Ag is increased by allowing Pb and Bi to coexist. Although a solid solution of Ag in glass is precipitated as fine particles of Ag during temperature decrease at the time of firing, the presence of Bi moderates the precipitation of Ag relative to a change in the firing temperature, broadening a firing margin. Due to the above effects, electric characteristics are improved and both the Li-containing system and the Li-free system achieve the FF value equal to or greater than 75, which defines an acceptance range. However, as is the case with Pb, because of a strong effect of eroding Si, an excessive addition amount of Bi makes erosion too strong and has adverse effects such as deterioration in electric characteristics and reduction in the firing margin and, therefore, the appropriate amount of Bi$_2$O$_3$ is 15 (mol %) or less and more preferably 12 (mol %) or less.

Although the present invention has been described in detail with reference to the drawings, the present invention may also be implemented in other forms and may variously be modified within a range not departing from the spirit thereof.

NOMENCLATURE OF ELEMENTS

10: solar cell 12: silicon substrate 14: n layer 16: p$^+$ layer 18: antireflection film 20: light-receiving surface electrode 22: rear surface electrode 24: light-receiving surface 26: entire surface electrode 28: belt-like electrode

The invention claimed is:

1. A conductive paste composition for a solar cell comprising a conductive powder, a glass frit, and an organic vehicle, the glass frit comprising glass that comprises SO$_2$ within a range of 0.05 to 5.0 mol % in terms of oxide.

2. The conductive paste composition for a solar cell of claim 1, wherein the glass further comprises Pb and Si in a Pb/Si mol ratio within a range of 0.8 to 2.3, and 0.6 to 18 mol % of Li$_2$O, 18 to 64 mol %; of PbO, 1 to 18 mol % of B$_2$O$_3$, and 15 to 47 mol % of SiO$_2$ in terms of oxide.

3. The conductive paste composition for a solar cell of claim 2, wherein the glass comprises 0.1 to 5.0 mol % of SO$_2$, 1 to 15 mol % of Li$_2$O, 22 to 62 mol % of PbO, 1 to 15 mol % of B$_2$O$_3$, and 20 to 41 mol % of SiO$_2$ in terms of oxide.

4. The conductive paste composition for a solar cell of claim 2, wherein the glass further comprises at least one selected from the group consisting of Al$_2$O$_3$ at 18 mol % or less, TiO$_2$ at 18 mol % or less, and ZnO at 30 mol % or less in terms of oxide.

5. The conductive paste composition for a solar cell of claim 1, wherein the glass further comprises Pb and Si in a Pb/Si mol ratio within a range of 1.4 to 2.5, and 50 to 70 mol % of PbO, 1 to 8 mol % of B$_2$O$_3$, and 20 to 40 mol % of SiO$_2$ in terms of oxide without Li$_2$O.

6. The conductive paste composition for a solar cell of claim 5, wherein the Pb/Si mol ratio is within a range of 1.7 to 2.3, and the glass comprises 0.1 to 3.0 mol % of SO$_2$, 55 to 62 mol % of PbO, 3 to 6 mol % of B$_2$O$_3$, and 28 to 34 mol of SiO$_2$ in terms of oxide.

7. The conductive paste composition for a solar cell of claim 5, wherein the glass further comprises at least one selected from the group consisting of Al$_2$O$_3$ at 5 mol % or less, TiO$_2$ at 10 mol % or less, and ZnO at 10 mol % or less in terms of oxide.

8. The conductive paste composition for a solar cell of claim 2, wherein the glass further comprises 0.1 to 15 mol % of Bi$_2$O$_3$ in terms of oxide.

9. The conductive paste composition for a solar cell of claim 1, wherein the glass further comprises 6.0 mol % or less of P$_2$O$_5$ in terms of oxide.

10. A solar cell comprising a light-receiving surface electrode formed with a fire-through method from a paste for an electrode comprising a conductive powder, a glass frit, and an organic vehicle, the glass frit comprising glass that comprises SO$_2$ within a range of 0.05 to 5.0 mol % in terms of oxide.

11. The conductive paste composition for a solar cell of claim 1, wherein the conductive powder is selected from the group consisting of silver powder, nickel powder, and copper powder.

12. The conductive paste composition for a solar cell of claim 1, wherein the conductive powder is silver powder.

* * * * *